United States Patent
Kounga Njiwa et al.

(10) Patent No.: US 8,791,625 B2
(45) Date of Patent: Jul. 29, 2014

(54) CERAMIC MATERIAL, METHOD FOR PRODUCING SAID CERAMIC MATERIAL AND COMPONENT COMPRISING SAID CERAMIC MATERIAL

(75) Inventors: Alain Brice Kounga Njiwa, Dietikon (CH); Yongli Wang, Deutschlandsberg (AT); Irmgard Penzinger, Deutschlandsberg (AT)

(73) Assignee: Epcos AG, Munich (DE)

( * ) Notice: Subject to any disclaimer, the term of this patent is extended or adjusted under 35 U.S.C. 154(b) by 237 days.

(21) Appl. No.: 13/129,684

(22) PCT Filed: Nov. 6, 2009

(86) PCT No.: PCT/EP2009/064776
§ 371 (c)(1),
(2), (4) Date: Aug. 8, 2011

(87) PCT Pub. No.: WO2010/054994
PCT Pub. Date: May 20, 2010

(65) Prior Publication Data
US 2012/0098386 A1    Apr. 26, 2012

(30) Foreign Application Priority Data
Nov. 17, 2008  (DE) .......................... 10 2008 057 721

(51) Int. Cl.
*H01L 41/087*    (2006.01)
(52) U.S. Cl.
USPC ................ 310/358; 252/62.9 PZ; 252/62.9 R

(58) Field of Classification Search
USPC ........... 310/358, 357, 365, 311; 252/62.9 PZ, 252/62.9 R; 501/134
IPC ...................................... H01L 41/087
See application file for complete search history.

(56) References Cited

U.S. PATENT DOCUMENTS

| | | | |
|---|---|---|---|
| 5,637,542 A * | 6/1997 | Takenaka ................ | 501/134 |
| 6,004,474 A * | 12/1999 | Takenaka et al. ........ | 252/62.9 R |
| 6,387,295 B1 | 5/2002 | Saito | |
| 7,090,785 B2 | 8/2006 | Chiang et al. | |
| 8,573,755 B2 * | 11/2013 | Nawano ................... | 310/365 |
| 2003/0134738 A1 * | 7/2003 | Furukawa et al. ..... | 252/62.9 PZ |

FOREIGN PATENT DOCUMENTS

| | | |
|---|---|---|
| CN | 1848304 | 10/2006 |
| CN | 101226827 | 7/2008 |
| JP | 2000-313664 | 11/2000 |
| JP | 2002-220280 | 8/2002 |
| JP | 2007-238376 | 9/2007 |
| JP | 2008-120665 | 5/2008 |

OTHER PUBLICATIONS

Zhang Shan-Tao et al., Lead-free piezoceramics with giant strain in the system Bio,5Na0,5TiO3—K0,5Na0,5NbO3.II., Temperature dependent properties, *Journal of Applied Physics*, 103, (2008).

(Continued)

*Primary Examiner* — Thomas Dougherty
*Assistant Examiner* — Karen B Addison
(74) *Attorney, Agent, or Firm* — Cozen O'Connor

(57) ABSTRACT

The invention relates to a ceramic material of the formula $[(Bi_{0.5}Na_{0.5}TiO_3)_{(1-y)}(BaTiO_3)_y]_{(1-x)}(K_{0.5}Na_{0.5}NbO_3)_x$, and also to a method for producing the same and to a component comprising said material.

15 Claims, 25 Drawing Sheets

(56) References Cited

OTHER PUBLICATIONS

Chiang Yet-Ming et al., Lead-free high-strain single-crystal piezoelecrics in the alkaline-bismuth-titanate perovskite family, *Applied Physics Letters*, vol. 73, No. 25 (1998).

Grankzow T. et al., Field-induced phase transitions in Bismuth-based perovskites: a new approach to lead-free high-strain piezoceramics, Applications of Ferroelectrics, ISAF 2008. *17th IEEE International Symposium on the IEEE*, Piscataway, NJ (2008).

Saito Y. et al., Lead-free Piezoceramics, *Nature*, vol. 432, pp. 84-87 (2004).

Takenaka T. et al., Bi1/2Na1/2)TiO3—BaTiO3 System for Lead-Free Piezoelectric Ceramics, *Japanese Journal of Applied Physics*, vol. 30, No. 9B, pp. 2236-2239 (1991).

Zhang Shan-Tao et al., Lead-free piezoceramics with a giant strain in the system Bi0,5Na0,5TiO3—BaTiO3 system, *Applied Physics Letters* 91, (2007).

Zhang Shan-Tao et al., Lead-free piezoceramics with a giant strain in the system Bi0,5Na0,5TiO3—K0,5Na0,5Nb03.I. structure and room temperature properties, *Journal of Applied Physics* 103, (2008).

International Search Report dated Apr. 19, 2010.

"Zhang Shan-Tao et al., Lead-free piezoceramics with giant strain in the system Bi0, 5Na0, 5TiO3—BaTiO3—K0, 5Na0, 5NbO3.II. Temperature dependent properties", *Journal of Applied Physics*, 103, 034108 (2008).

"Zhang Shan-Tao et al., Giant strain in Lead-free piezoceramics Bi0, 5Na0, 5TiO3—BaTiO3—K0, 5NbO3 system", *Applied Physics Letters* 91, 112906 (2007); ISSN 0003-6951.

\* cited by examiner

CERAMIC MATERIAL, METHOD FOR PRODUCING SAID CERAMIC MATERIAL AND COMPONENT COMPRISING SAID CERAMIC MATERIAL

PRIORITY CLAIM

This is a U.S. national stage of application No. PCT/EP2009/064776, filed on Nov. 6, 2009. Priority is claimed on the following application: German Application No.: 1.0 2008 057 721.9 Filed on Nov. 17, 2008, the content of which is incorporated here by reference.

BACKGROUND OF THE INVENTION

Ceramic material, method for producing said ceramic Material and component comprising said ceramic material The invention relates to a ceramic material and to a method for producing said ceramic material. Furthermore, the invention relates to a component comprising said ceramic material and to the use of said component.

Materials which undergo a change in their spatial extent when exposed to a specific applied electric field or produce electric charge if a mechanical load is applied, and therefore have piezoelectric properties, are used, for example, in actuators or sensors. For this use, high elongations of the material are desired as a response to relatively small applied electric fields or large charges are desired in the event of relatively small mechanical loads. Conventional piezoelectric materials, for example $(PbZr)TiO_3$, have a high lead content, for example of 60%, which is harmful to people and the environment.

It is an object of the invention to provide a novel ceramic material which has piezoelectric properties and a high piezoelectric coefficient. This object is achieved by a material according to claim 1. Further claims relate to embodiments of the ceramic material, to a method for producing said ceramic material, to a component comprising said ceramic material and to the use of said component.

SUMMARY OF THE INVENTION

In one embodiment, provision is made of a ceramic material of the formula $[(Bi_{0.5}Na_{0.5}TiO_3)_{(1-y)}(BaTiO_3)_y]_{(1-x)}(K_{0.5}Na_{0.5}NbO_3)_x$, where $0<x\leq0.12$ and $0.1\leq y\leq 0.5$. The material has a ternary system, where ternary means that the ceramic material is composed of three components, bismuth sodium titanate $Bi_{0.5}Na_{0.5}TiO_3$ (BNT), barium titanate $BaTiO_3$ (BT) and potassium sodium niobate $K_{0.5}Na_{0.5}NbO_3$ (KNN), where the proportions of the three components are variable depending on the parameters x and y used.

The material can also be lead-free. The use of toxic lead, for example in actuators or sensors, is thus avoided and handling of the material is simplified. By way of example, it is therefore possible to produce electronic components comprising said material which are harmless to people and the environment.

In the material, KNN and $BNT_{(1-y)}BT_y$ can be regarded as two base components, KNN having an orthorhombic crystal structure and $BNT_{(1-y)}BT_y$ having a tetragonal crystal structure where $y\geq0.07$. The material can then have either an orthorhombic or a tetragonal crystal structure or else both crystal structures.

When KNN is added in $BNT_{(1-y)}BT_y$, the number of cations in the system increases, the distribution of the cations within a unit cell being irregular. This leads to the formation of local random fields in the material. If the concentration of KNN in the system $[(Bi_{0.5}Na_{0.5}TiO_3)_{(1-y)}(BaTiO_3)_y]_{(1-x)}(K_{0.5}Na_{0.5}NbO_3)_x$ ($[BNT_{(1-y)}(BT)_y]_{(1-x)}(KNN)_x$ hereinbelow) is increased, the irregularity and therefore the number of random fields are increased, such that the random fields destroy each polarization induced in the material above a certain KNN concentration.

A polarization is induced during each polarization operation of the material, but this disappears as soon as the applied electric field is switched off. As a result, the ceramic material has neither a remanent polarization nor a remanent elongation, i.e. a polarization or an elongation present after the electric field has been switched off. Consequently, what is known as the unipolar elongation is the same as the polarization elongation (the elongation produced during the first polarization operation of the material) and can be restored compared to conventional piezoceramics, which have a single polarization elongation.

During the measurement of a unipolar elongation, the electric field is varied as follows: 0 kV/mm→$E_{max}$→0 kV/mm. During the measurement of a bipolar elongation, the electric field is varied as follows: 0 kV/mm→$E_{max}$→0 kV/mm→$E_{max}$→0 kV/mm.

The material has increased piezoelectric properties, such as for example a high piezoelectric coefficient of up to 700 pm/V given an electric field of, for example, 2.8 kV/mm. Here, the piezoelectric coefficient denotes the ratio between the measured elongation and the applied electric field. In the material, it is also the case that the piezoelectric coefficient which is measured in the case of small electric fields can be up to 150 pC/N.

In one embodiment, it is possible that x=0.09 and y=0.2 in the material. In further embodiments, it may be the case that x=0.085 and y=0.3, x=0.1 and y=0.15, x=0.075 and y=0.4, x=0.07 and y=0.5 and x=0.06 and y=0.1. For the compositions where x=0.1 and y=0.15, x=0.06 and y=0.1, x=0.09 and y=0.2, x=0.085 and y=0.3, x=0.075 and y=0.4 and x=0.07 and y=0.5, the ceramic material has particularly high large-signal piezoelectric coefficients of up to 700 pm/V and is therefore suitable, by way of example, for use in actuators. For other compositions, the material may have high small-signal piezoelectric coefficients of up to 150 pC/N. These materials are therefore highly suitable for use in sensors.

The invention also relates to a method for producing a material having the above-mentioned properties. The method comprises the following steps:

A) powdery oxygen-containing compounds of Bi, Na, K, Ti, Ba and Nb are mixed in a stoichiometric ratio to produce a starting mixture, B) the starting mixture is ground and calcined to produce a powdery solid solution, and C) the powdery solid solution is pressed and sintered.

The material can therefore be produced, for example, using a mixed oxide method, in which the stoichiometric ratio is chosen such that a material of the composition $[(Bi_{0.5}Na_{0.5}TiO_3)_{(1-y)}(BaTiO_3)_y]_{(1-x)}(K_{0.5}Na_{0.5}NbO_3)_x$, where $0<x\leq0.12$ and $0.1\leq y\leq0.5$, is produced.

In method step A) of the method, starting materials can be selected from a group comprising oxides and carbonates of Bi, Na, K, Ti, Ba and Nb. By way of example, $Bi_2O_3$, $Na_2CO_3$, $K_2CO_3$, $TiO_2$, $BaCO_3$ and $Nb_2O_5$ can be selected. These compounds are weighed out and mixed according to the desired stoichiometric ratio.

Furthermore, in method step B), the starting mixture can be ground in a solvent, dried and calcined at a temperature in the range of 800° C. to 950° C. Anhydrous ethanol can be chosen as the solvent, for example, and the calcination can take place, for example, at a temperature of 900° C. with a holding time of, for example, three hours.

Furthermore, in method step C), the powdery solid solution can be ground, for example over a period of 24 hours. The ground powdery solid solution can be pressed to form disks, which are green bodies, and sintered at a temperature in the range of 1150° C. to 1200° C. The pressed disks can have a diameter of 15 mm, for example, and can be pressed at 70 MPa. The sintering can take place at a temperature of 1150° C., for example, and can be carried out in an aluminum-coated container. In order to reduce volatilization of the readily volatile elements bismuth, sodium and potassium, the pressed disks can be embedded in the corresponding powders during the sintering. The density of the sintered material can be between 95% and 98% of the theoretical density.

The invention also relates to a component comprising at least one ceramic base body and at least two electrodes arranged on the base body, wherein the ceramic layer comprises a material having the above-mentioned properties. The component can also comprise a base body, which comprises a multiplicity of stacked ceramic layers with electrodes arranged therebetween, wherein the electrodes are electrically contacted via external electrodes arranged on the outer surface of the base body. By way of example, the electrodes can be contacted in an alternating manner. This makes it possible to provide components which undergo elongation in one direction (displacement) when a voltage is applied.

A component of this type can be used, for example, as a piezo actuator or multilayered actuator. By way of example, a piezo actuator can be used for injection systems. The component having the above-mentioned properties can also be used as a sensor for the detection of pressures and accelerations. However, further possible uses are also conceivable with one of the above-mentioned materials.

The invention will be explained in more detail with reference to the figures and exemplary embodiments:

DETAILED DESCRIPTION OF THE PRESENTLY PREFERRED EMBODIMENTS

Figure 1:
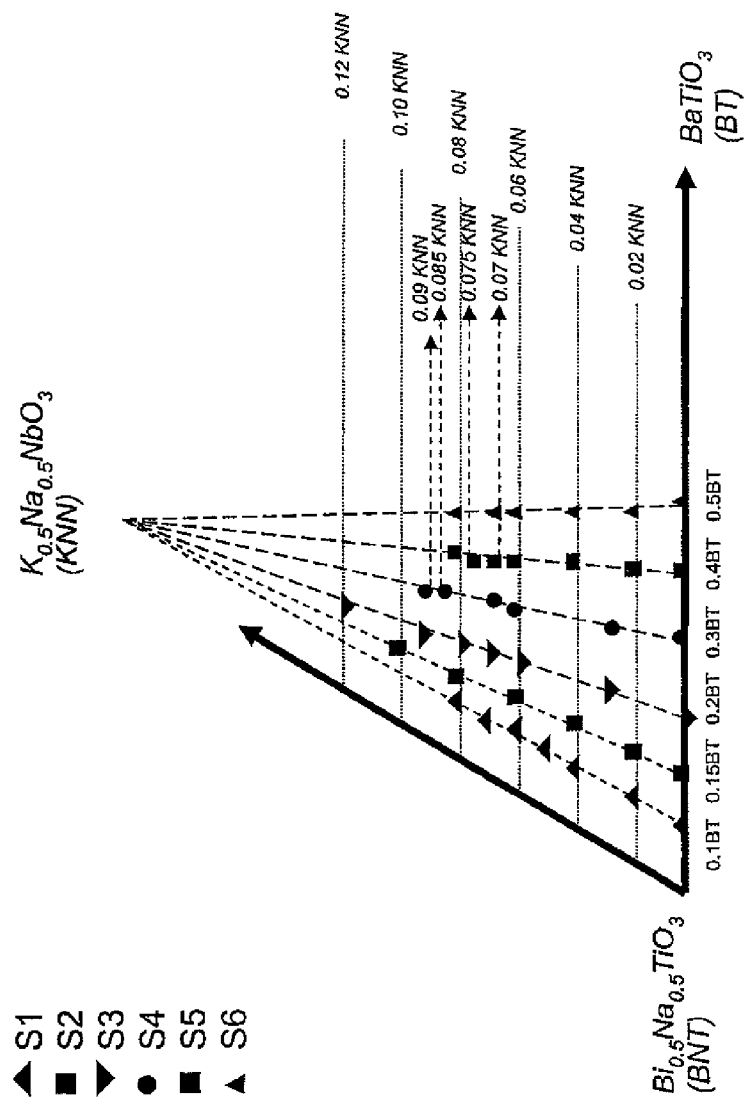
FIG. 1 shows an overview of possible compositions of the ternary system of the ceramic material.

FIG. 1 shows an overview of possible compositions of the ternary system of the ceramic material made of the components BNT, BT and KNN. The proportion of BT is plotted on the x axis, and the proportion of BNT can be calculated automatically therefrom according to the general formula. The proportion of KNN is plotted on the y axis. The specific compositions are then entered in the graph with defined x and y values, where identical symbols represent in each case a composition with an identical y value (BT and BNT ratio), the x value being variable. The graph as a whole is merely to be understood as schematic and not true to scale.

Here, S1 denotes the compositions S1 $[BNT_{0.9}(BT)_{0.1}]_{(1-x)}(KNN)_x$, where y=0.1. In the graph, the composition S1 is plotted for x=0 (as reference), x=0.02, x=0.04, x=0.05, x=0.06, x=0.07 and x=0.08.

Here, S2 denotes the compositions $[BNT_{0.85}(BT)_{0.15}]_{(1-x)}(KNN)_x$, where y=0.15. In the graph, the composition S2 is plotted for x=0 (as reference), x=0.02, x=0.04, x=0.06, x=0.08 and x=0.1.

Here, S3 denotes the compositions $[BNT_{0.8}(BT)_{0.2}]_{(1-x)}(KNN)_x$, where y=0.2. In the graph, the composition S3 is plotted for x=0 (as reference), x=0.03, x=0.06, x=0.07, x=0.08, x=0.09 and x=0.12.

Here, S4 denotes the compositions $[BNT_{0.7}(BT)_{0.3}]_{(1-x)}(KNN)_x$, where y=0.3. In the graph, the composition S4 is plotted for x=0 (as reference), x=0.03, x=0.06, x=0.07, x=0.085 and x=0.09.

Here, S5 denotes the compositions $[BNT_{0.6}(BT)_{0.4}]_{(1-x)}(KNN)_x$, where y=0.4. In the graph, the composition S5 is plotted for x=0 (as reference), x=0.02, x=0.04, x=0.06, x=0.07, x=0.075 and x=0.08.

Here, S6 denotes the compositions $[BNT_{0.5}(BT)_{0.5}]_{(1-x)}(KNN)_x$, where y=0.5. In the graph, the composition S6 is plotted for x=0 (as reference), x=0.02, x=0.04, x=0.06, x=0.07 and x=0.08.

Further compositions (not listed here) are also possible within the scope of the general formula of the ceramic material given above.

Figure 2A:
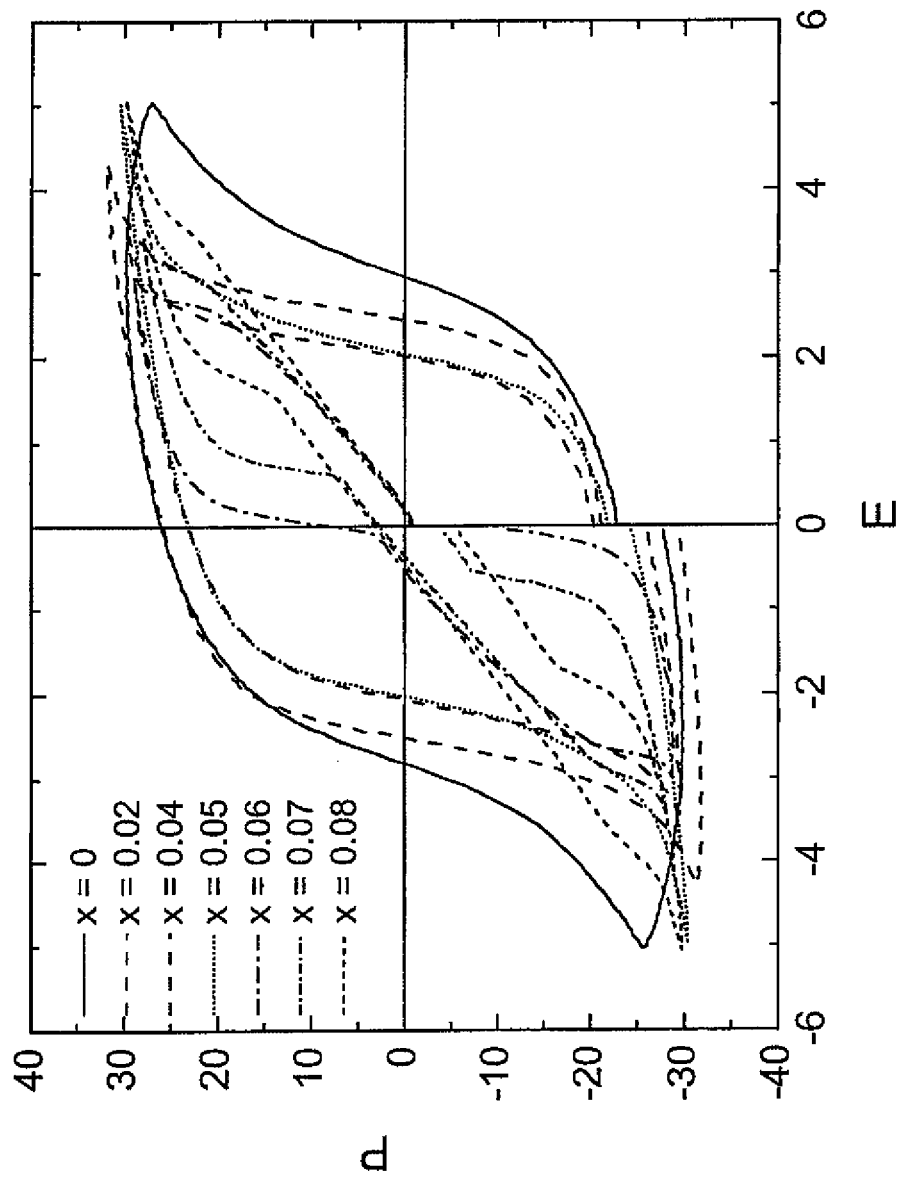
FIG. 2 shows a) polarization hystereses and b) the bipolar elongation hystereses of exemplary materials where y=0.1.
Figure 2B:
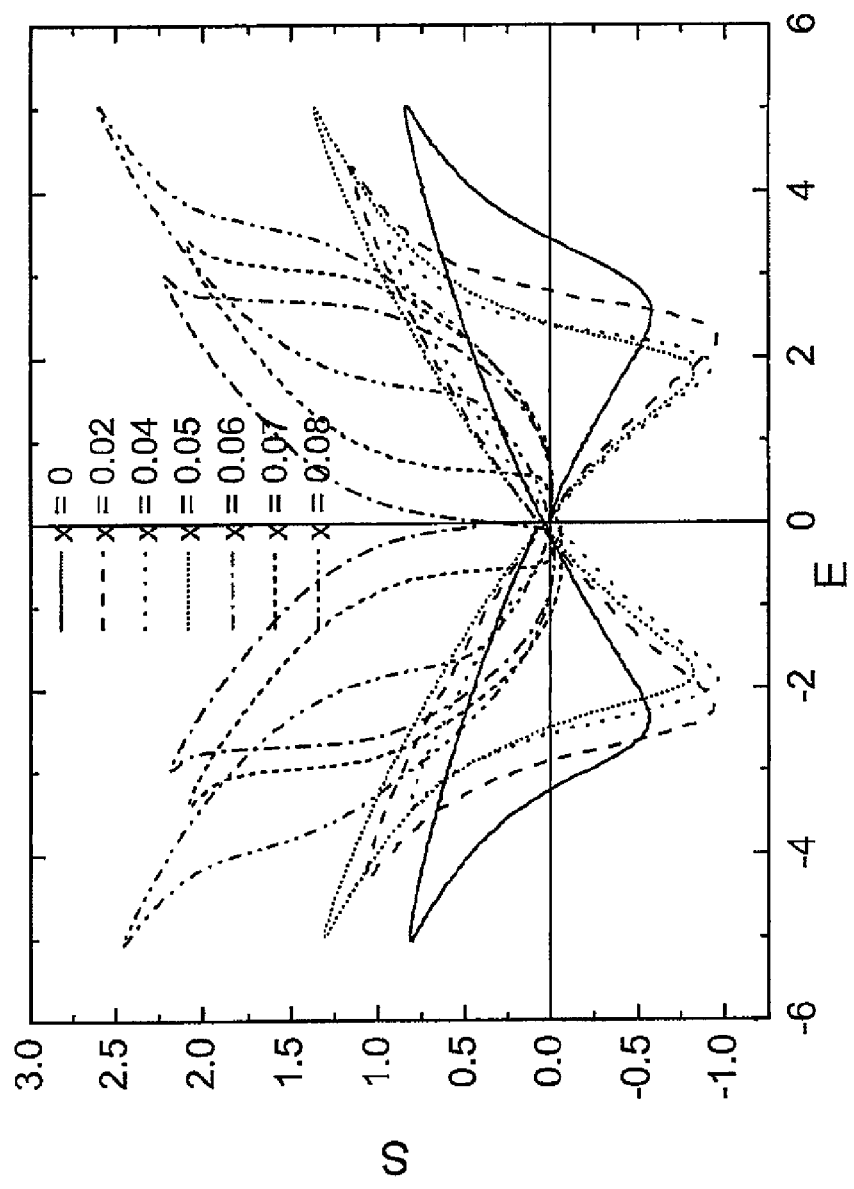
Figure 3A:
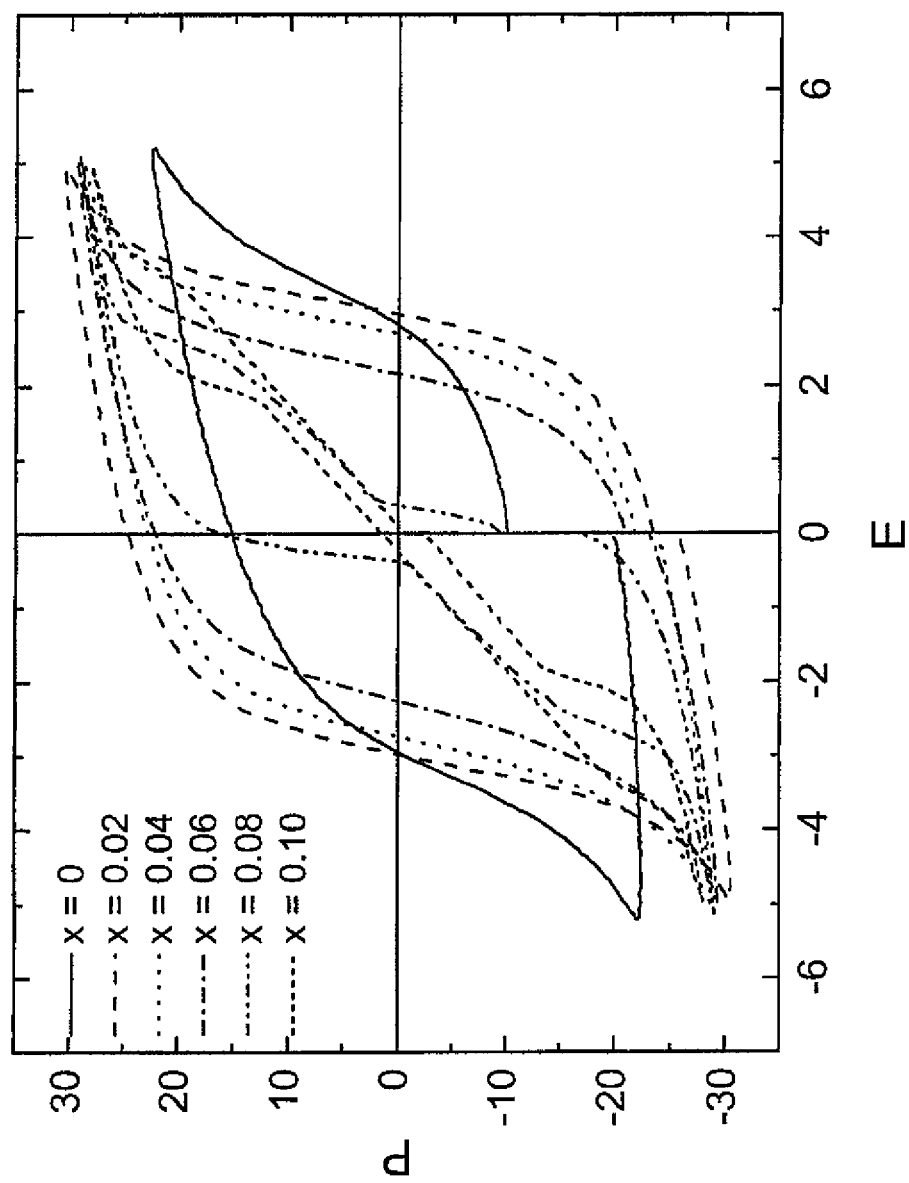
FIG. 3 shows a) polarization hystereses and b) bipolar elongation hystereses of exemplary materials where y=0.15.
Figure 3B:
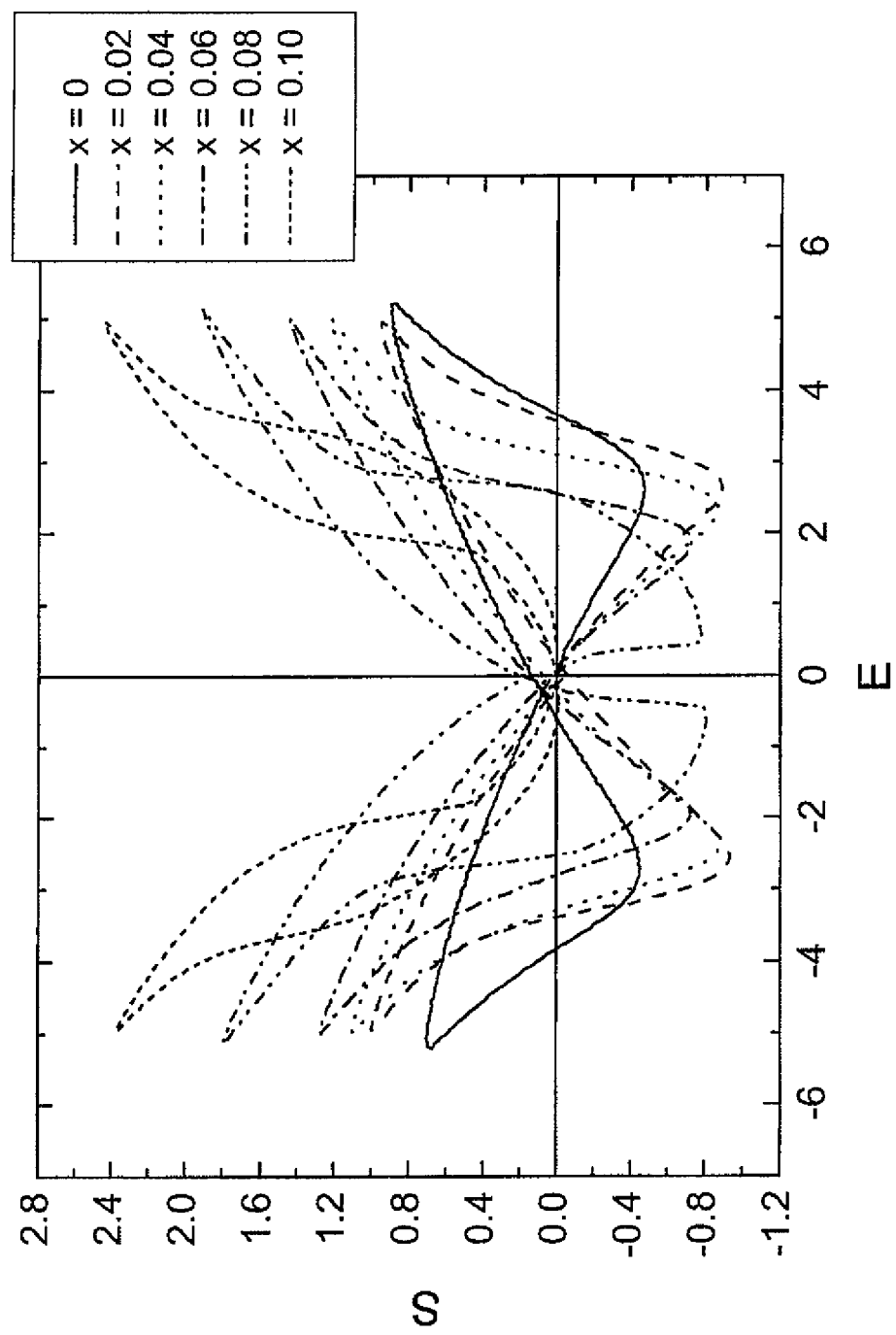
Figure 4A:
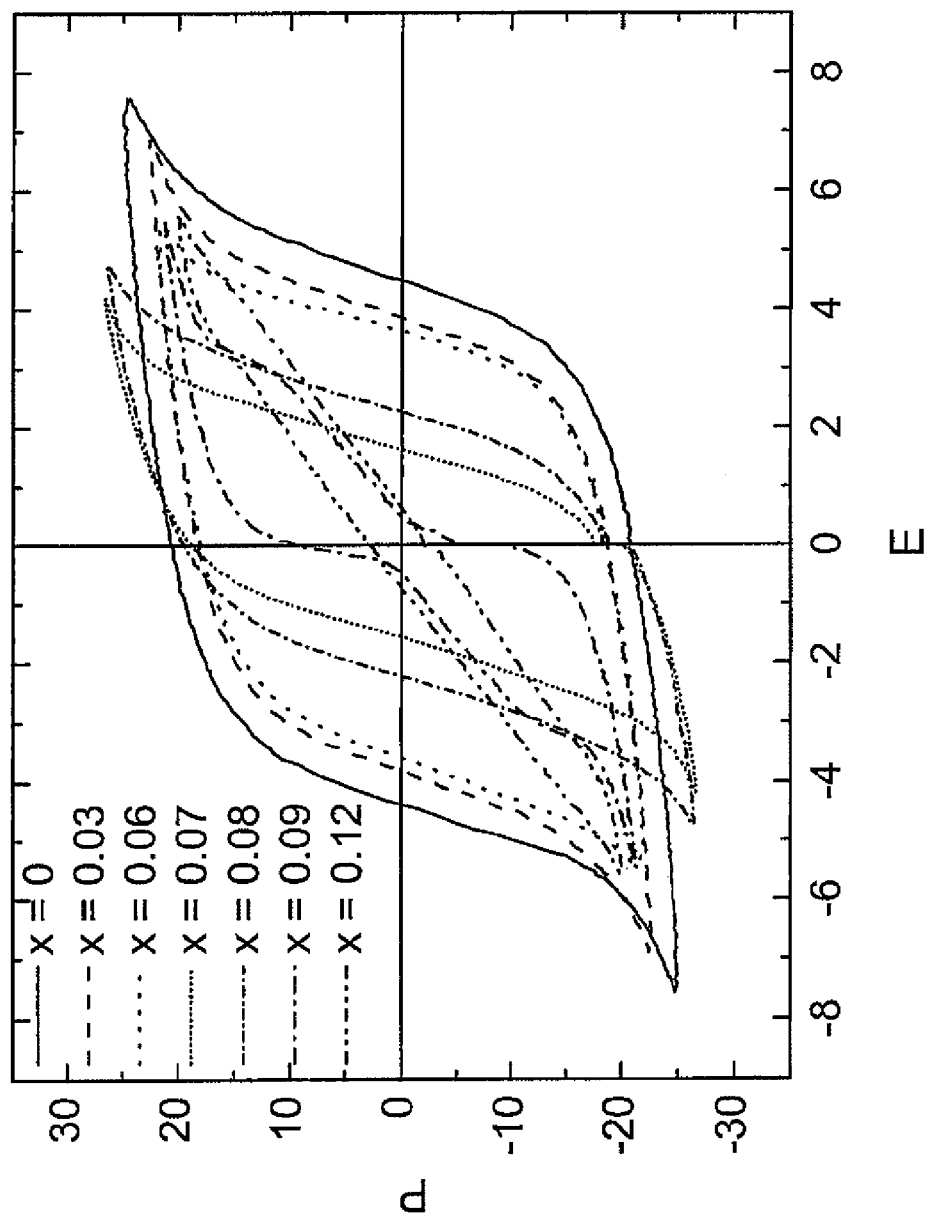
FIG. 4 shows a) polarization hystereses and b) bipolar elongation hystereses of exemplary materials where y=0.2.
Figure 4B:
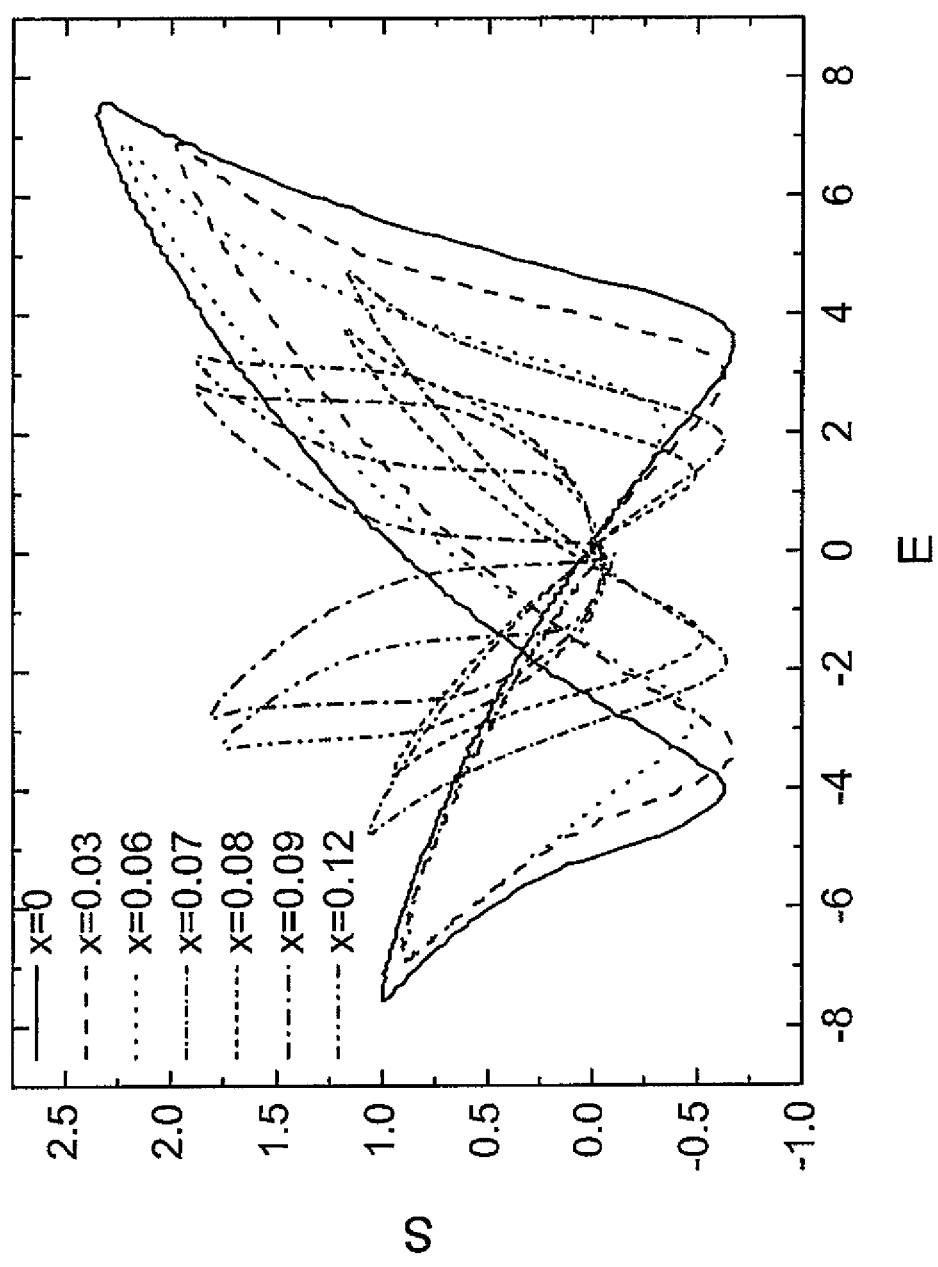
Figure 5A:
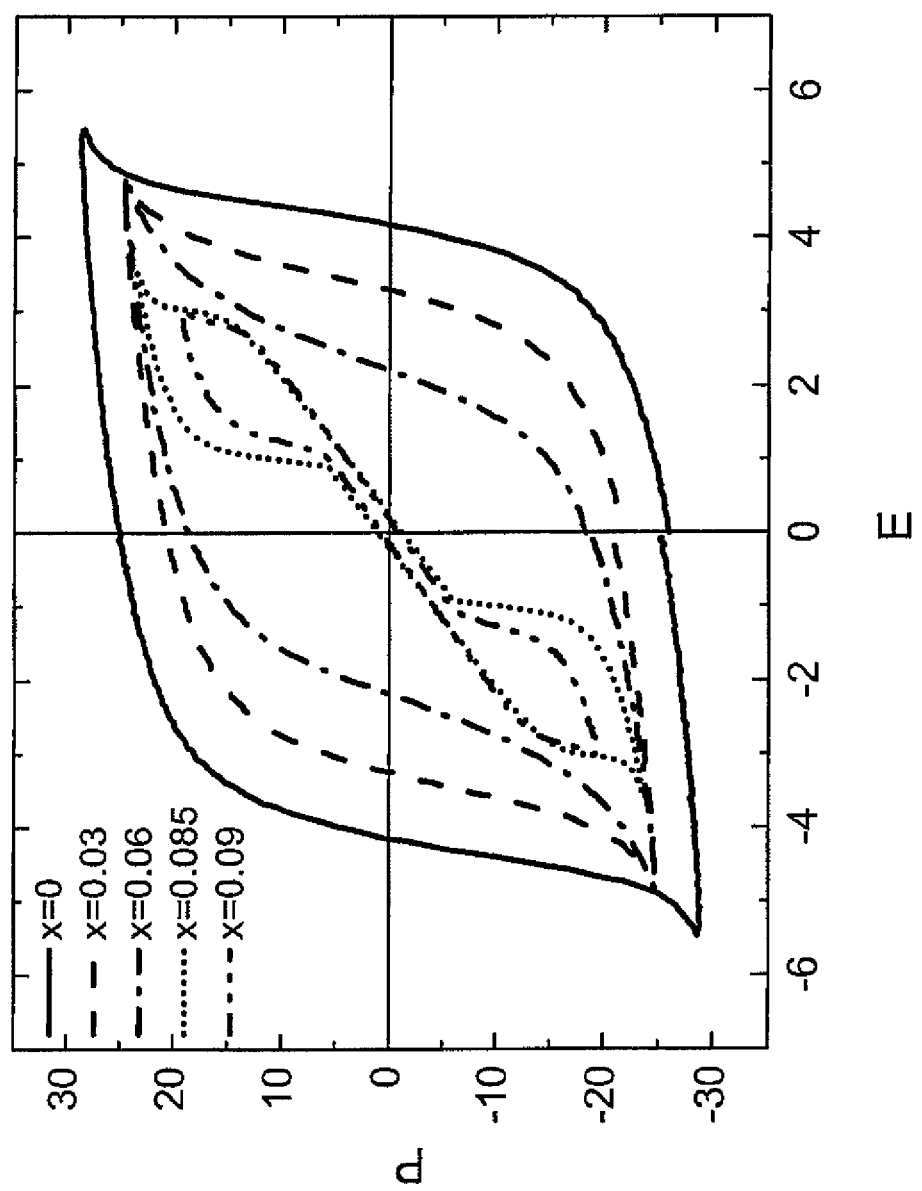
FIG. 5 shows a) polarization hystereses and b) bipolar elongation hystereses of exemplary materials where y=0.3.
Figure 5B:
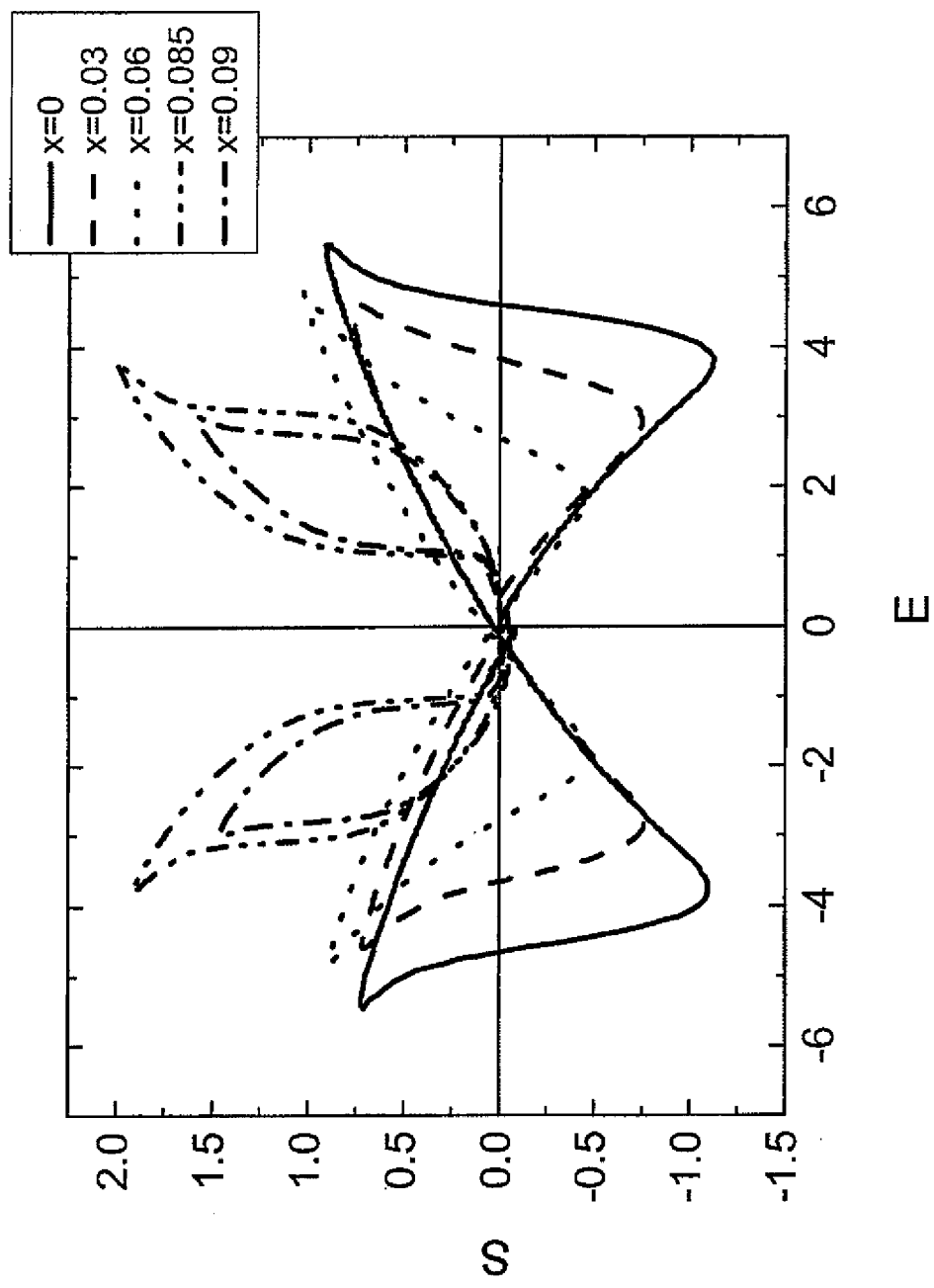
Figure 6A:
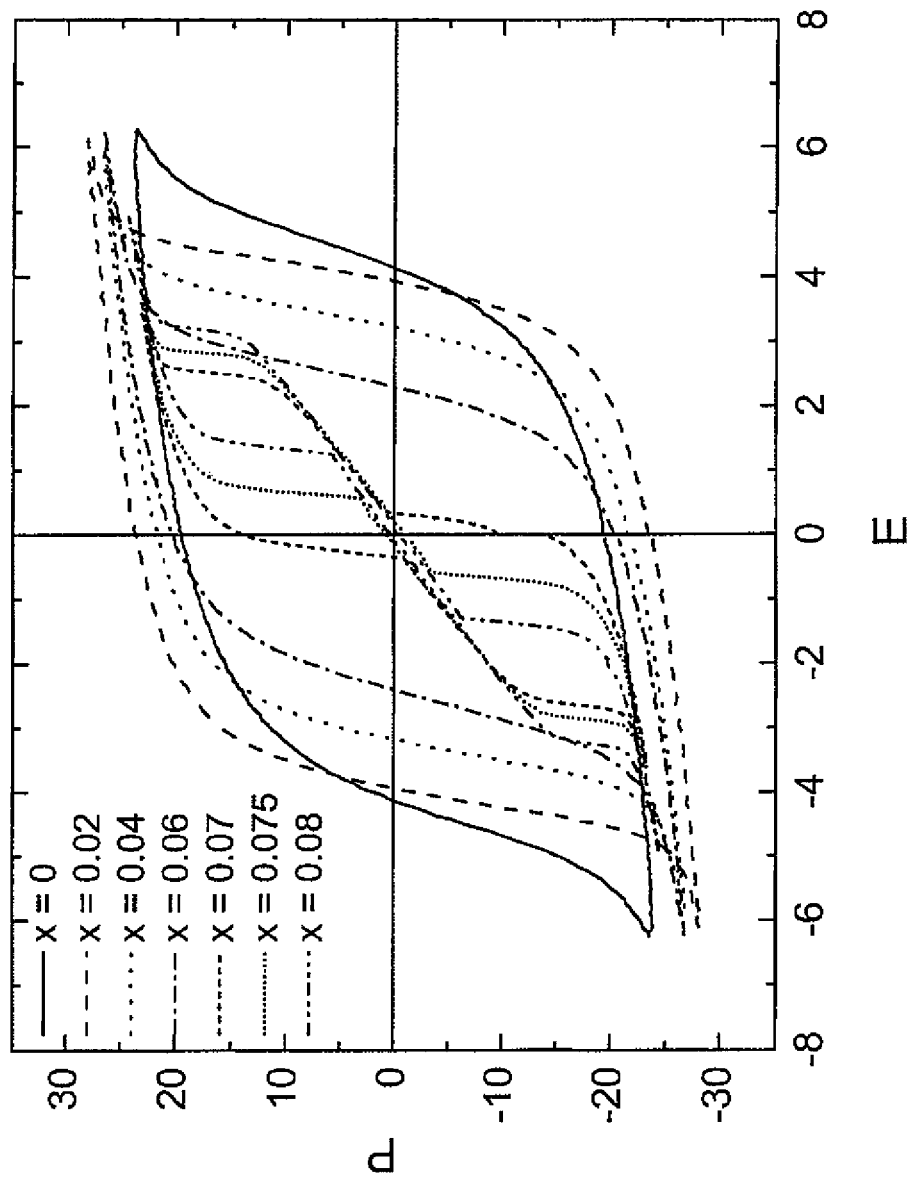
FIG. 6 shows a) polarization hystereses and b) bipolar elongation hystereses of exemplary materials where y=0.4.
Figure 6B:
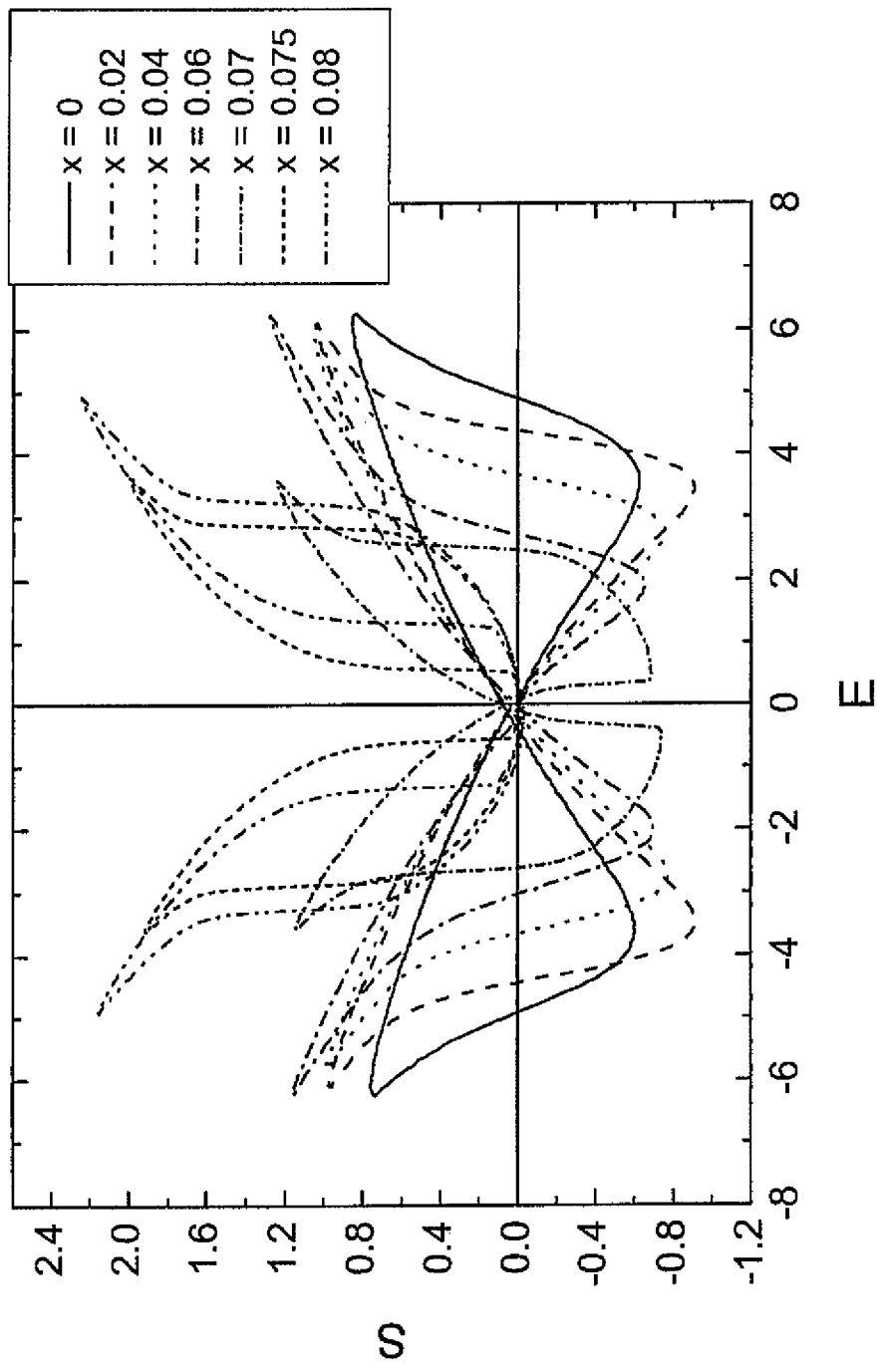
Figure 7A:
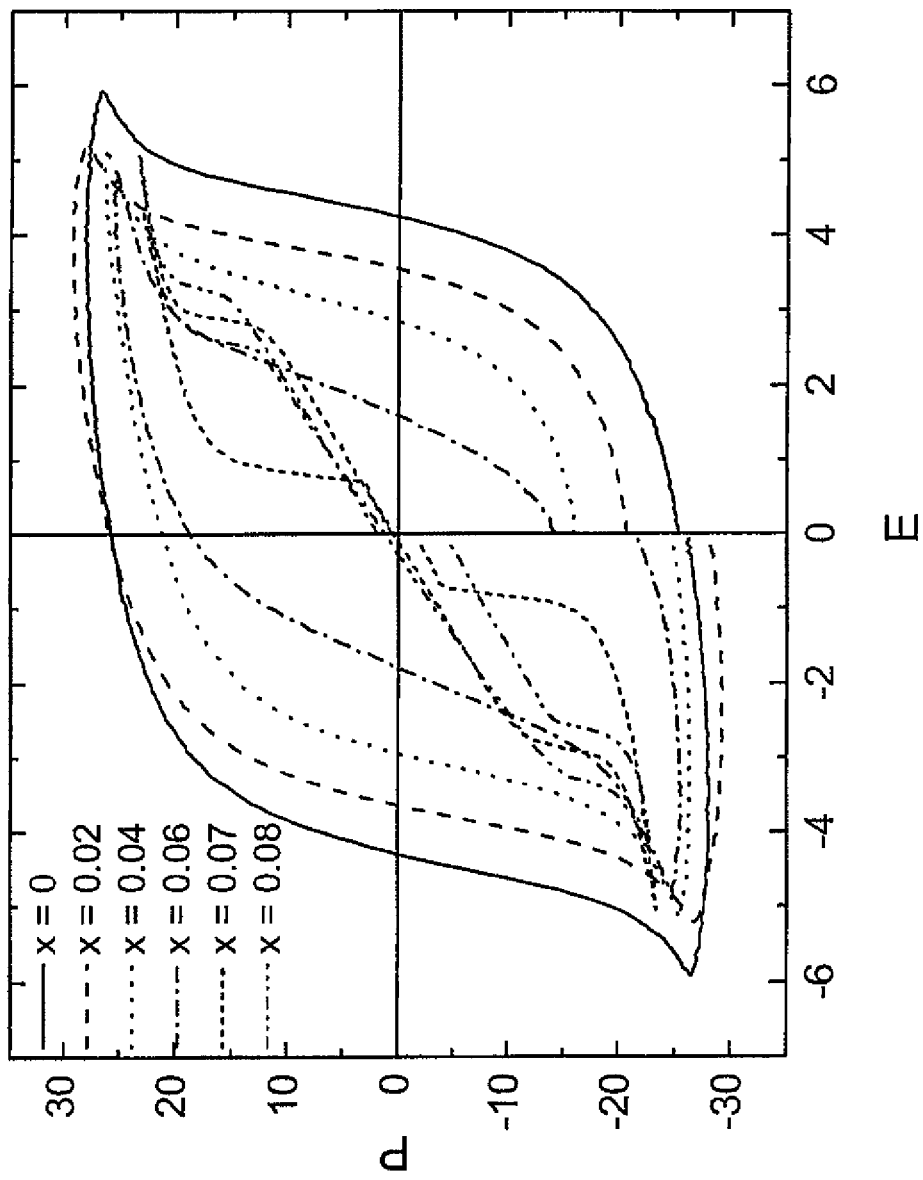
FIG. 7 shows a) polarization hystereses and b) bipolar elongation hystereses of exemplary materials where y=0.5.
Figure 7B:
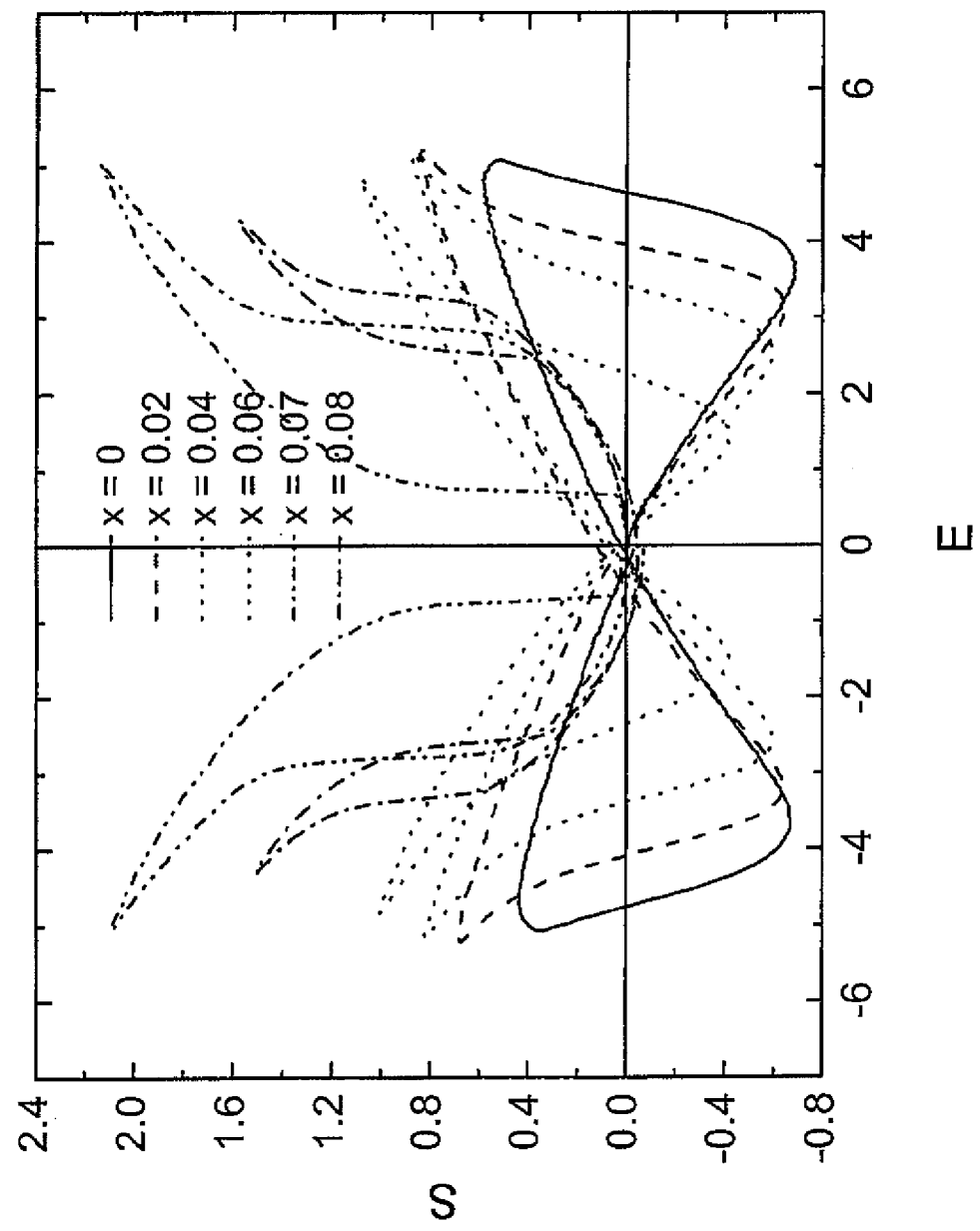

FIGS. 2 to 7 show the measured data of the following compositions:

FIGS. 2a and 2b: compositions S1,
FIGS. 3a and 3b: compositions S2,
FIGS. 4a and 4b: compositions S3 (for the sake of clarity, the data for x=0.07 and x=0.08 are not shown),
FIGS. 5a and 5b: compositions S4 (for the sake of clarity, the data for x=0.07 are not shown),
FIGS. 6a and 6b: compositions S5,
FIGS. 7a and 7b: compositions S6.

The electrical measurements on the material, which are shown in FIGS. 2a, 3a, 4a, 5a, 6a and 7a which follow, were carried out on sintered samples in disk form of the respective material. Before the measurements are made, a thin layer of silver is applied to the wide surfaces of the disks and dried for 30 minutes at 500° C. This provides layers of silver which serve as electrodes for the electrical measurements.

An offset in the hysteresis curves can be seen in part in FIGS. 2a, 3a, 4a, 5a, 6a and 7a. This offset may be caused by a partial discharge of the measurement capacitor or by a low conductivity of the sample, which can be remedied by appropriate sintering.

FIGS. 2a, 3a, 4a, 5a, 6a and 7a show the polarization hystereses for the respective compositions S1 to S6. In each of these figures, the applied field strength E in kV/mm is plotted against the polarization P in μC/cm². An electric field with a triangular waveform and with a frequency of 50 MHz is chosen for the measurement, and the measurement is carried out at room temperature.

It can be seen that the coercive field strength $E_c$, the electric field strength at P=0, decreases as x increases. In the case of a field of E=4 kV/mm to 8 kV/mm (depending on the composition investigated), polarization saturation occurs.

FIGS. 2b, 3b, 4b, 5b, 6b and 7b show bipolar elongation hystereses for the compositions S1 to S6 investigated. These measurements are carried out at the same time as the measurements of the polarization hystereses. The figures show the bipolar elongation S in ‰ as a function of the applied electric field E in kV/mm for the exemplary materials. In the case of a bipolar measurement, the applied field E is increased from 0 kV/mm to 8 kV/mm, then reversed to −8 kV/mm and finally increased back to 0 kV/mm. A bipolar variation of the field results in an elongation curve in the form of a butterfly.

Figure 8A:
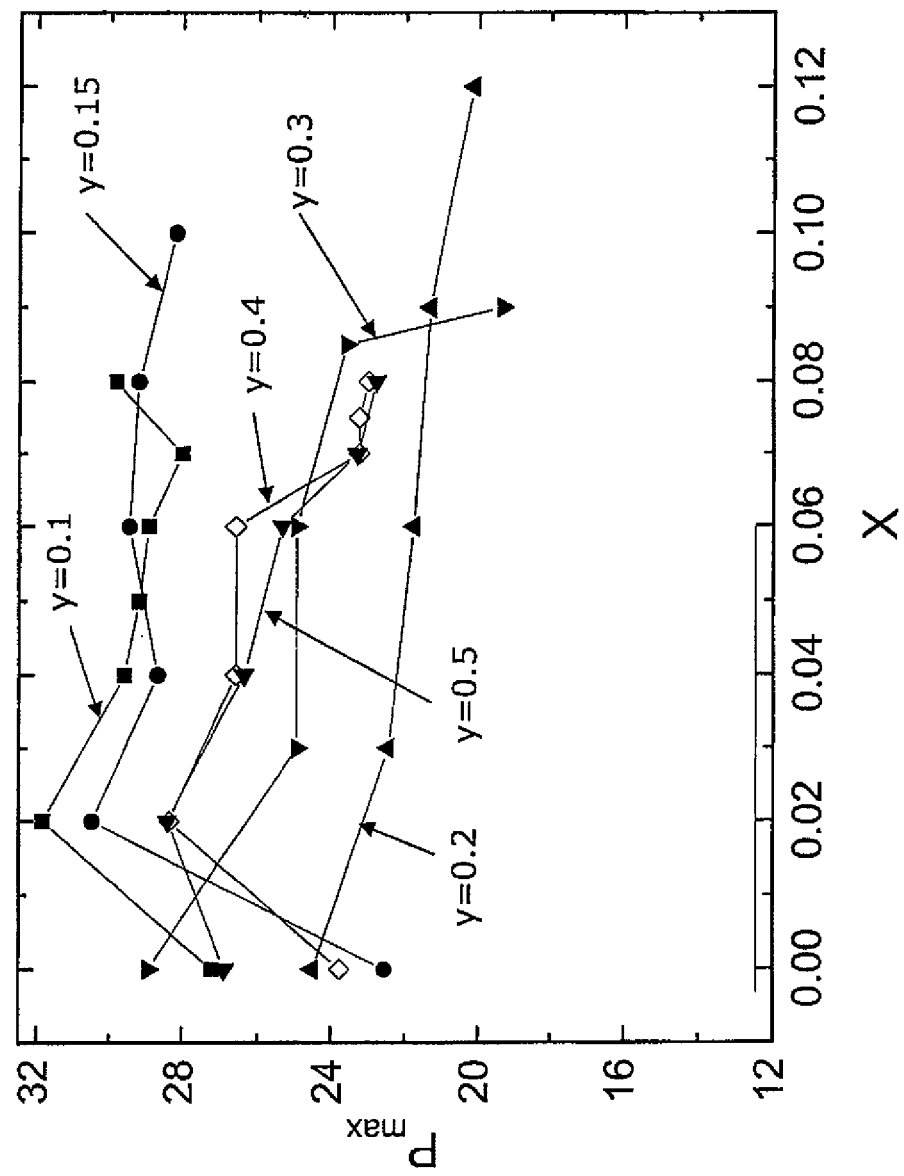
FIG. 8 shows the dependence of a) the maximum polarization, b) the remanent polarization and c) the coercive field on the composition of the material.
Figure 8B:
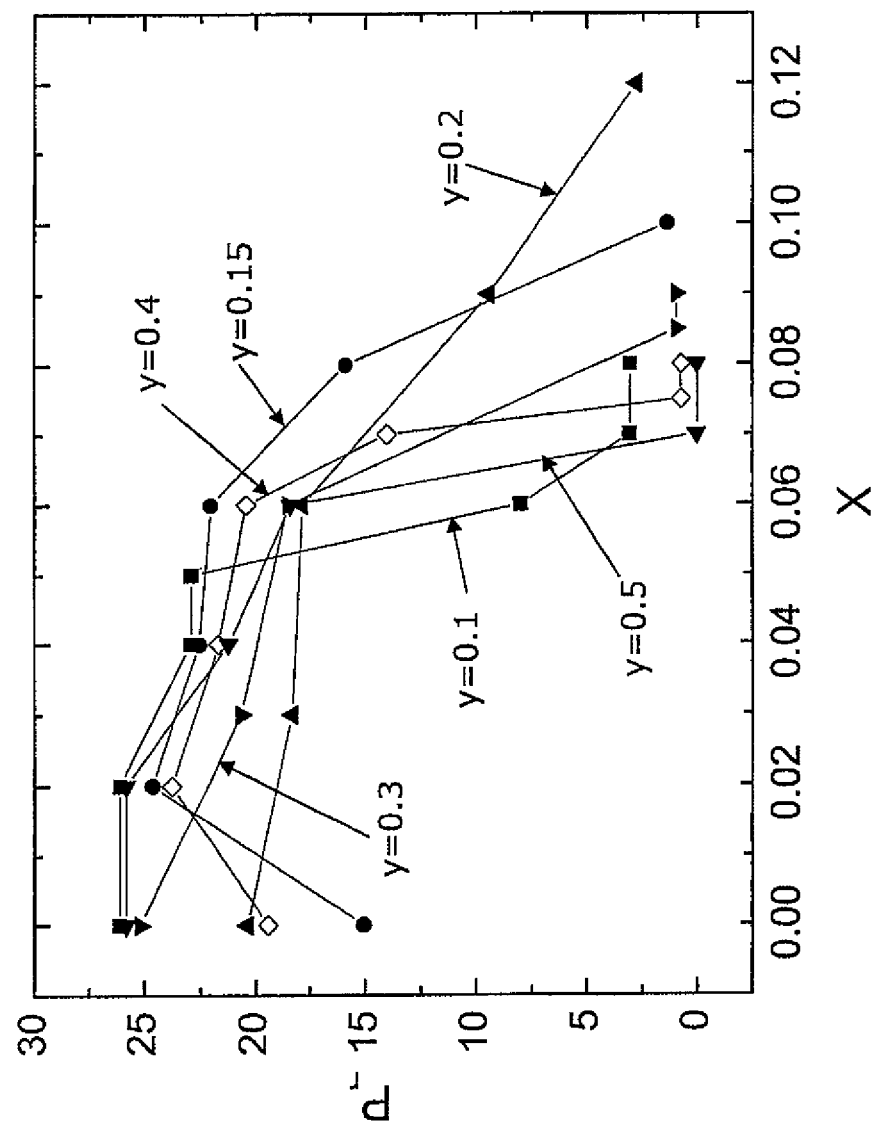
Figure 8C:
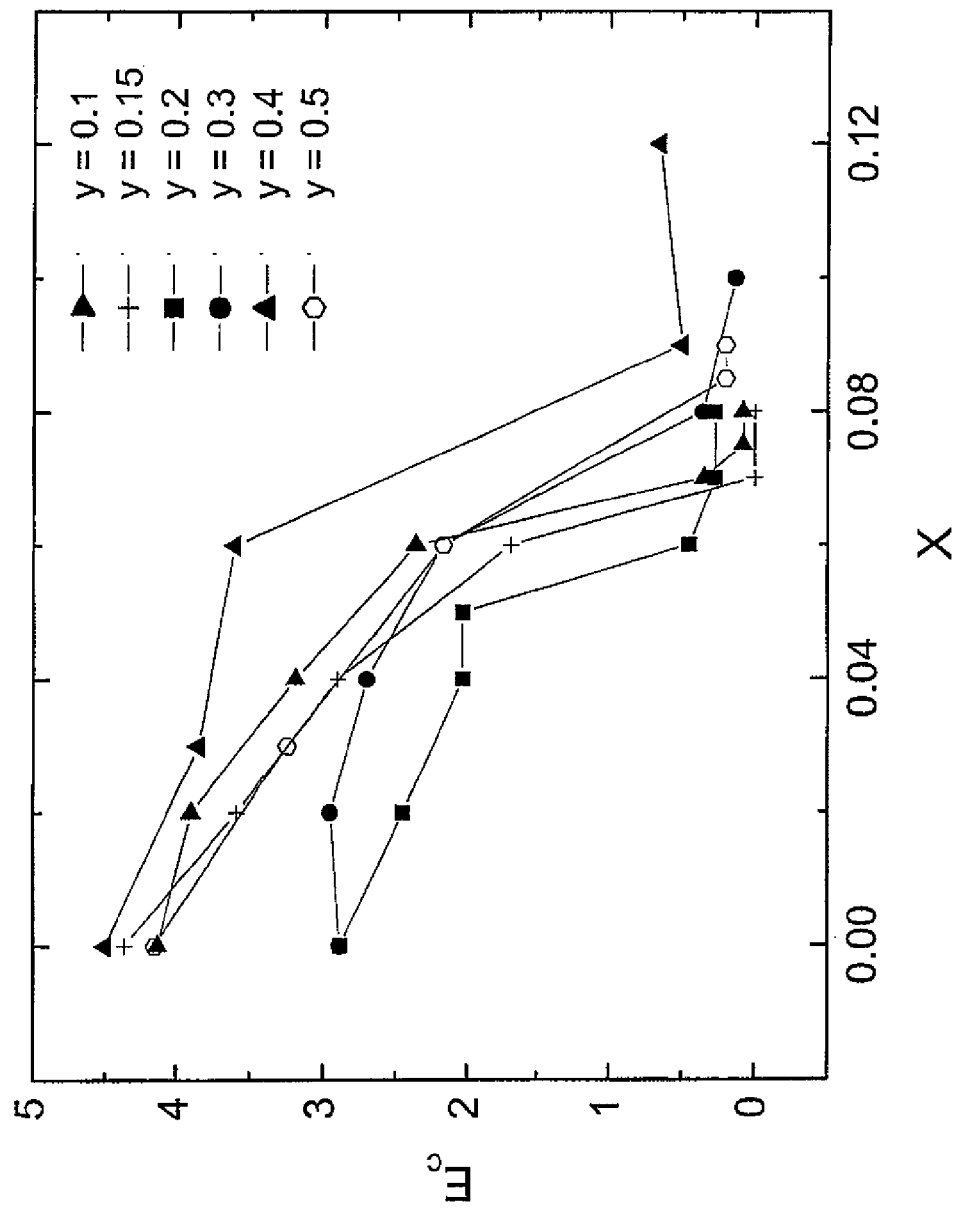

FIGS. 8a, 8b, 8c and also 9a and 9b summarize the characteristic values for some of the materials investigated.

FIG. 8a shows the maximum polarization $P_{max}$ in μC/cm² as a function of x, i.e. as a function of the composition of the material. FIG. 8b shows the remanent polarization $P_r$ in μC/cm² (the polarization given E=0 kV/mm) as a function of x. FIGS. 8a and 8b show the measured data of compositions where y=0.1, y=0.15, y=0.2, y=0.3, y=0.4 and y=0.5. FIG. 8c shows the coercive field strength $E_c$ in kV/mm (the field strength given a polarization of 0) as a function of x for these materials. $P_{max}$ is independent of x for all compositions for the purposes of measurement accuracy, whereas $P_r$ and $E_c$ show a large drop where x>0.6.

Depending on the use of the material, these polarization or coercive field strength values can be advantageous. By way of example, high values of the remanent polarization are highly suitable for use in sensors, whereas low values are beneficial for use in actuators.

Figure 9A:
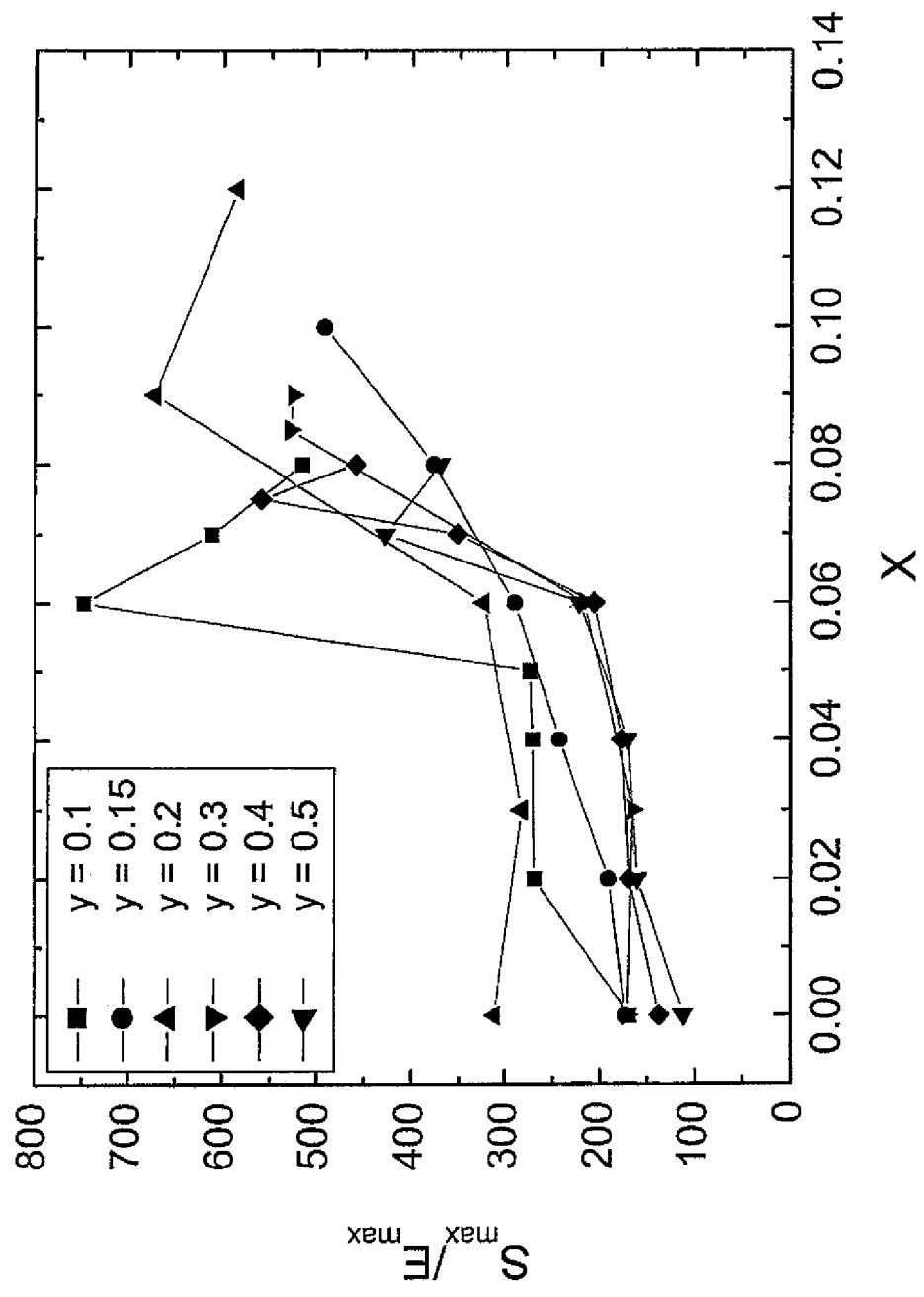
FIG. 9 shows the piezoelectric coefficient as a function of the composition of the material a) in the case of large electric fields and b) in the case of small electric fields and low mechanical loading.

FIG. 9a shows the large-signal piezoelectric coefficient in the form of the ratio between the maximum elongation $S_{max}$ and the maximum applied field $E_{max}$ $S_{max}/E_{max}$ in pm/V as a function of the composition of the material in the form of x, where y=0.1, y=0.15, y=0.2, y=0.3, y=0.4 and y=0.5. It is possible to achieve $S_{max}/E_{max}$ values of up to 700 pm/V, and this is especially highly suitable for use in actuators.

Figure 9B:
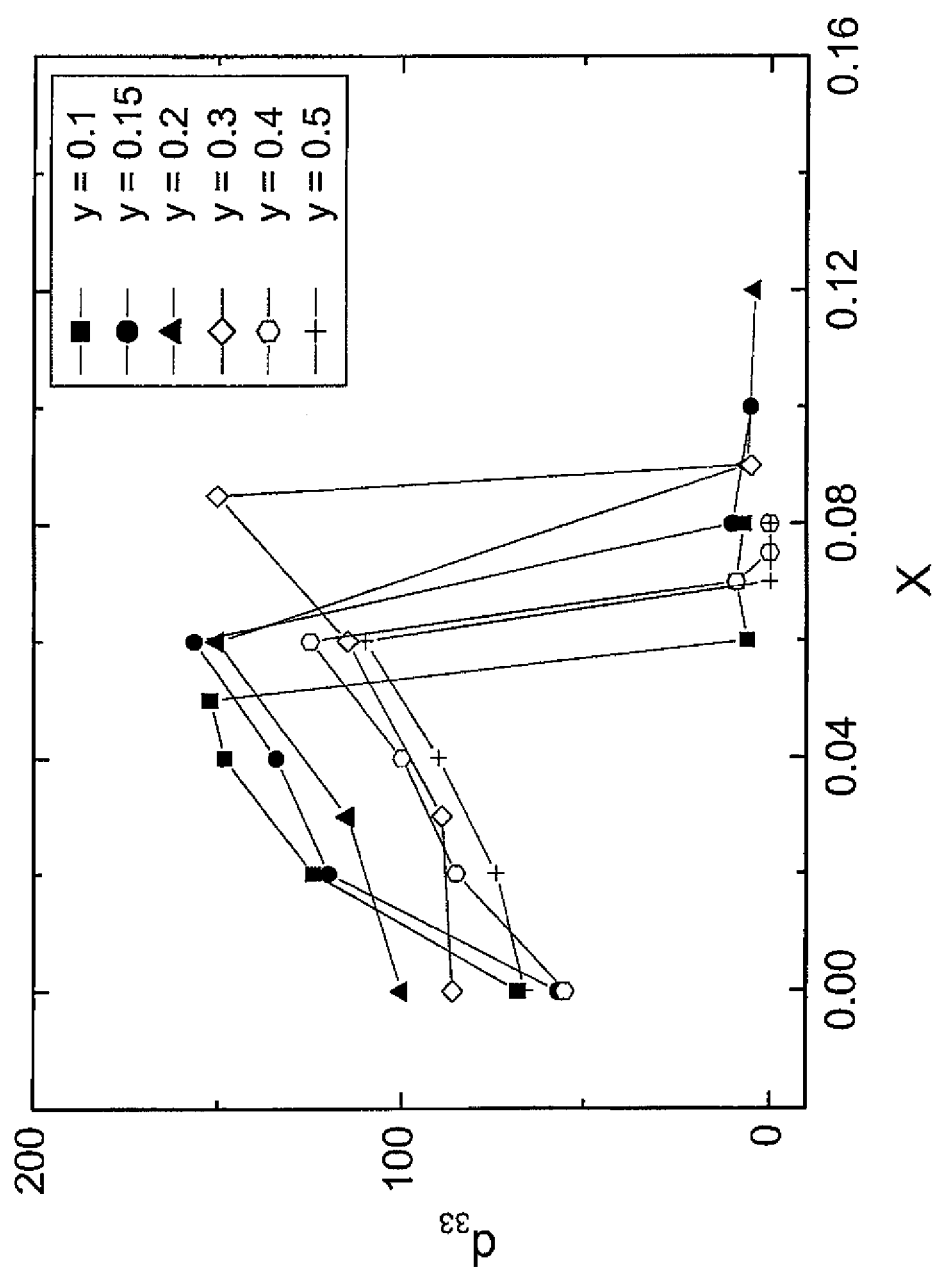

FIG. 9b shows the small-signal piezoelectric coefficient $d_{33}$ in pC/N as a function of the composition (x) for the materials from FIG. 9a. $d_{33}$ was determined at E=0 kV/mm using a Berlincourt meter, with samples that were polarized in a field of 7 kV/mm for 5 minutes at room temperature. All compositions where $d_{33}$>0 are highly suitable for use in sensors.

In a temperature-dependent impedance measurement (in the case of a temperature variation of 25° C. to 400° C.), the relative dielectric permittivity $\epsilon_r$ is determined at a frequency of 1 kHz. The depolarization temperature can be determined from the maxima of the measurement curves or from the temperatures at which the permittivity increases greatly. By way of example, this depolarization temperature is about 200° C. where y=0.1 and x=0.04 or about 150° C. where y=0.2 and x=0.03.

Figure 10A:
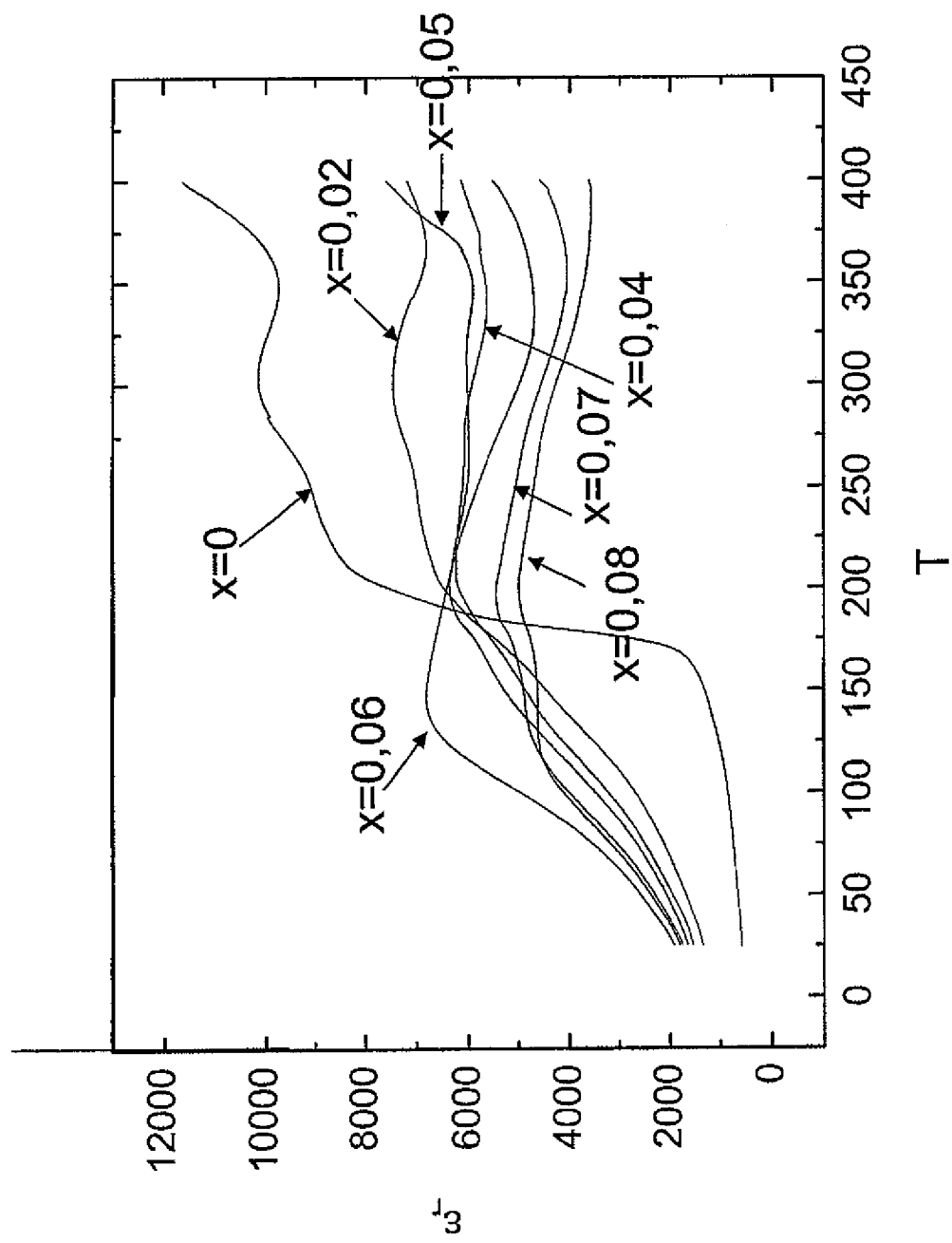
FIG. 10 shows the temperature-dependent relative permittivity of various compositions of the material for a) y=0.1, b) y=0.15, c) y=0.2, d) y=0.3, e) y=0.4 and f) y=0.5.
Figure 10B:
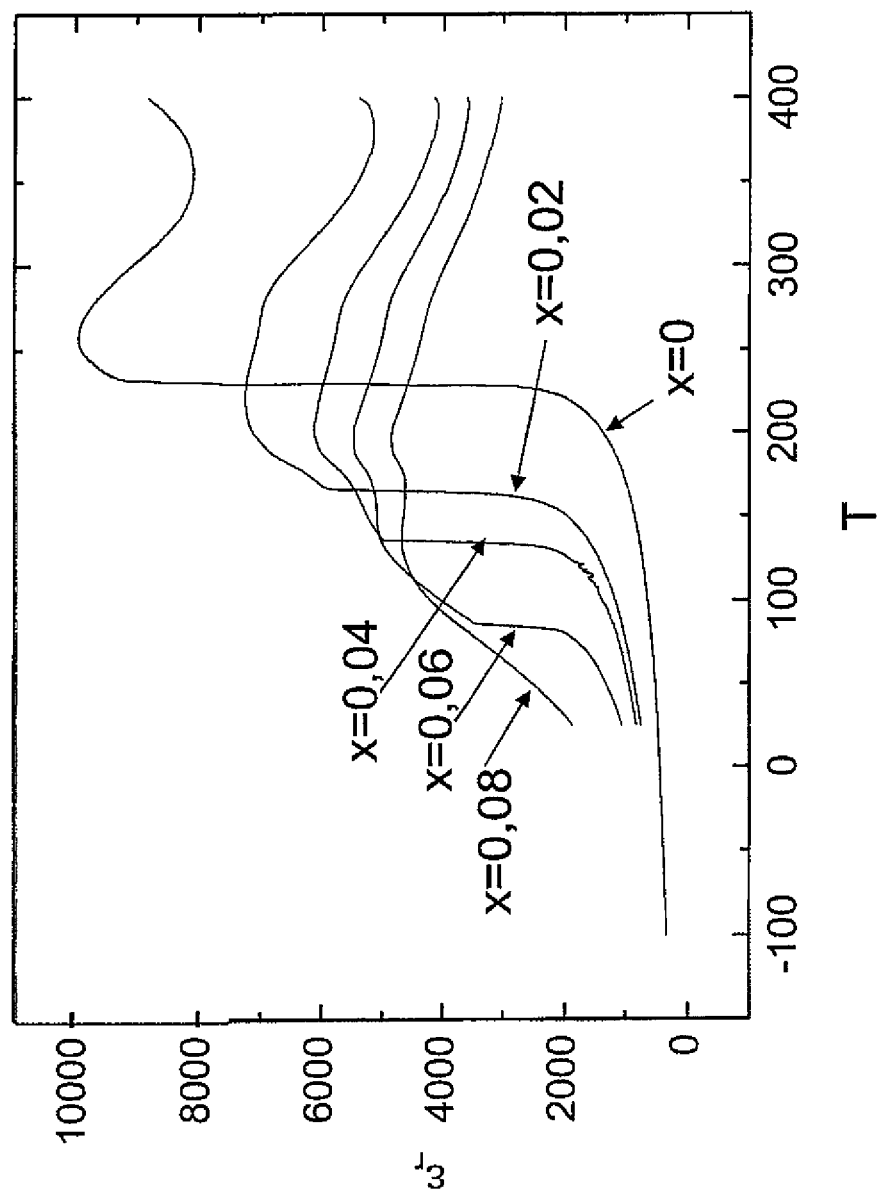
Figure 10C:
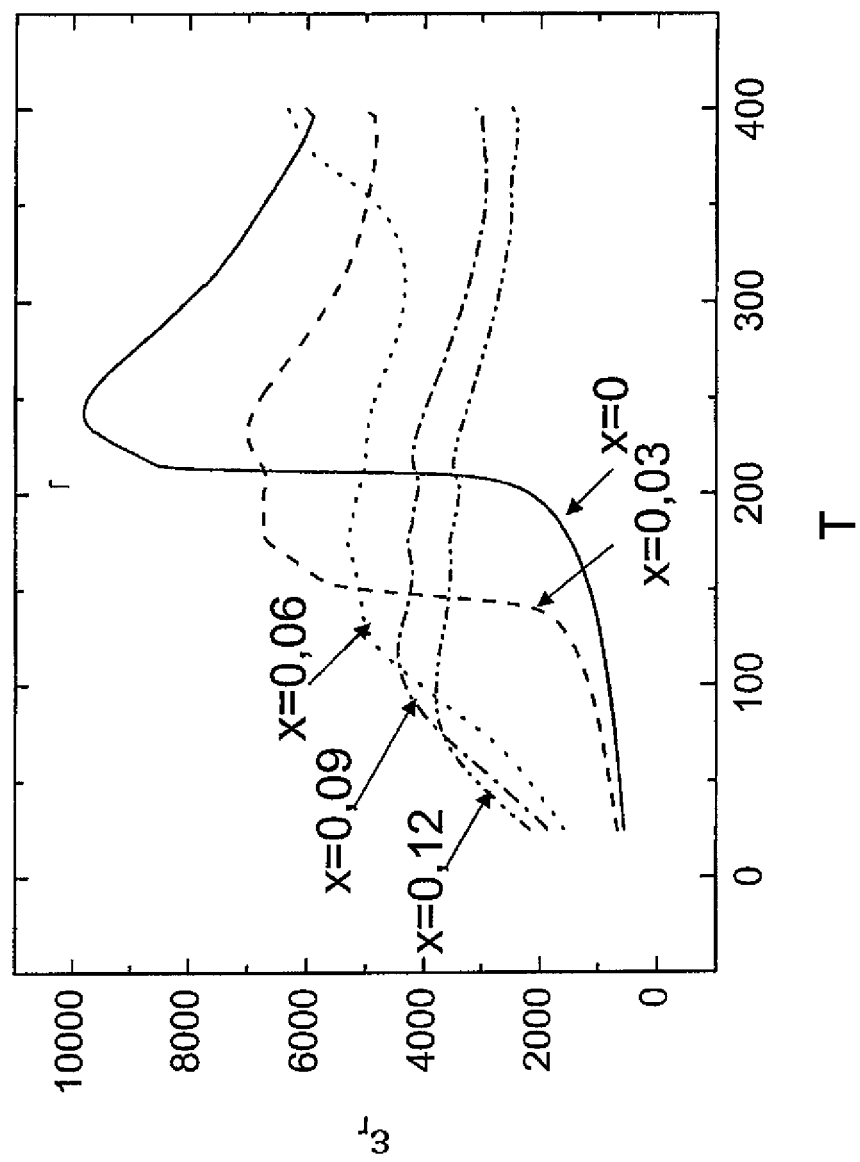
Figure 10D:
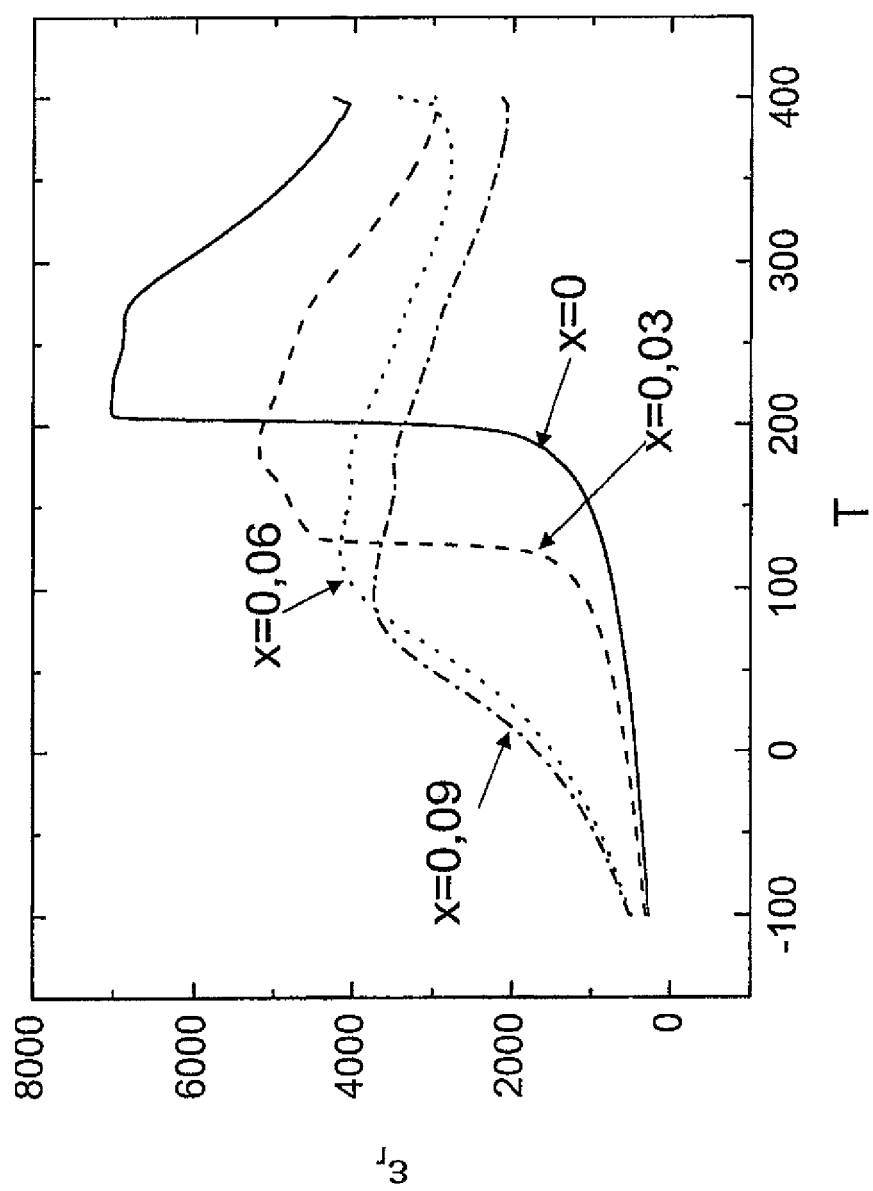
Figure 10E:
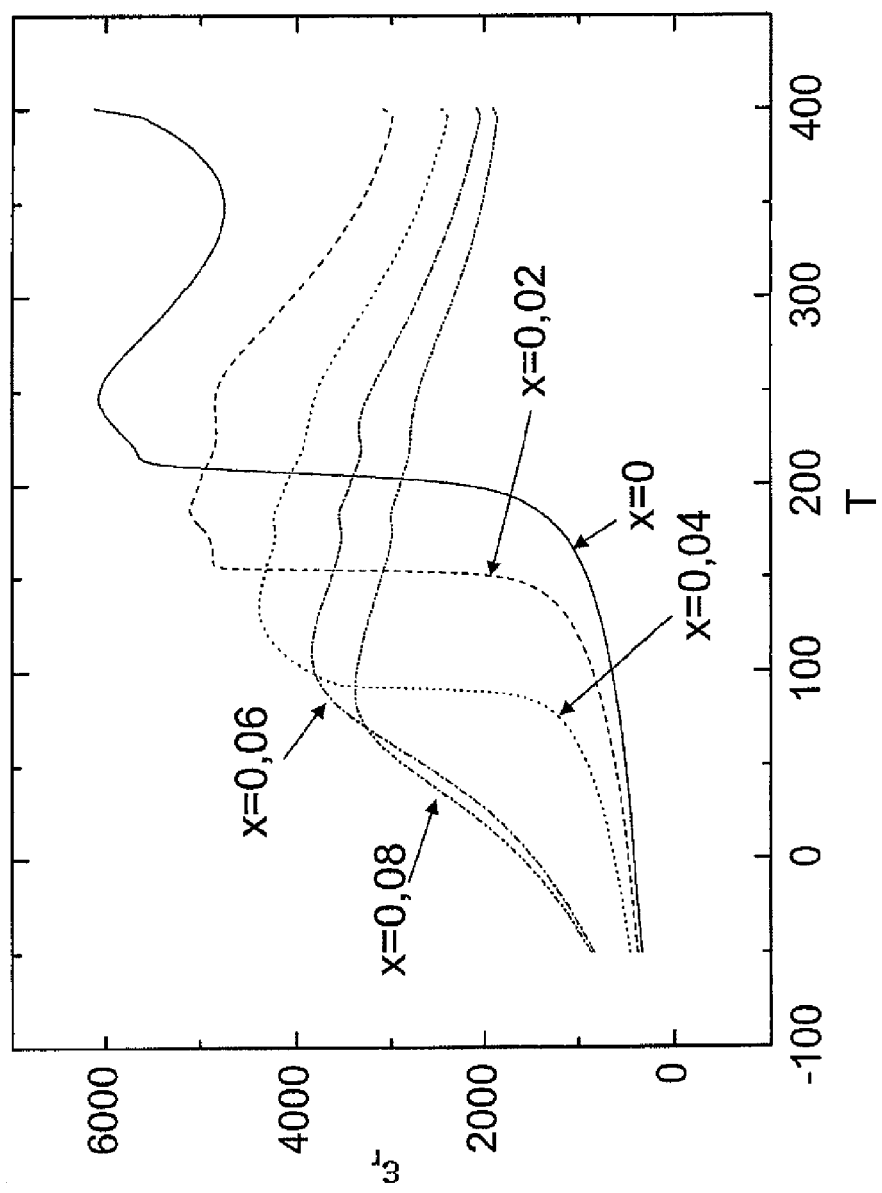
Figure 10F:
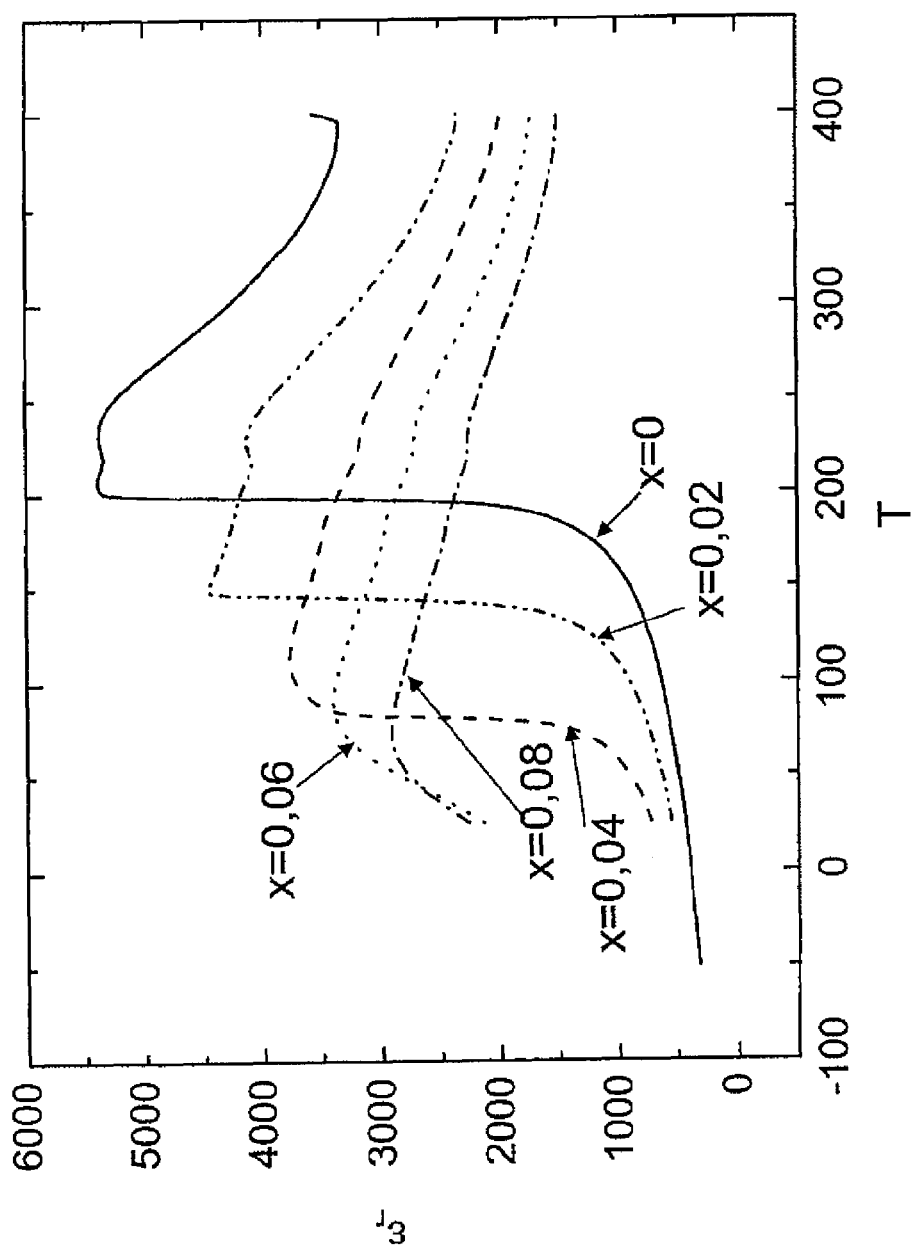

FIGS. 10a to 10f show the measured data of the following compositions:
FIG. 10a: compositions S1,
FIG. 10b: compositions S2 (for the sake of clarity, the data for x=0.1 are not shown),
FIG. 10c: compositions S3 (for the sake of clarity, the data for x=0.07 and x=0.08 are not shown),
FIG. 10d: compositions S4 (for the sake of clarity, the data for x=0.07 and x=0.085 are not shown),
FIG. 10e: compositions S5 (for the sake of clarity, the data for x=0.07 and x=0.075 are not shown),
FIG. 10f: compositions S6 (for the sake of clarity, the data for x=0.07 are not shown).

Figure 11:
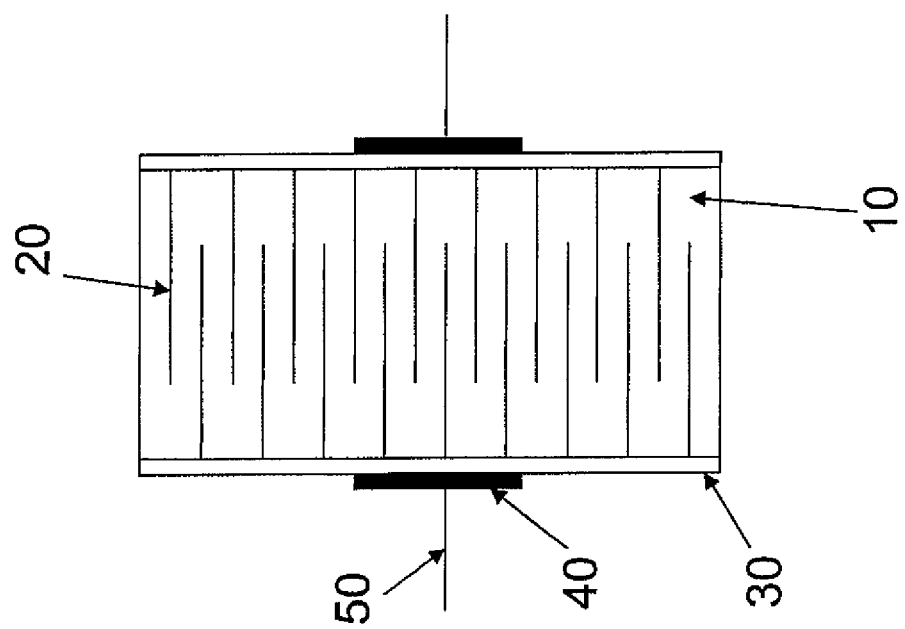
FIG. 11 shows a schematic side view of a component comprising the material.

FIG. 11 shows a schematic side view of a component which contains the material in one of the embodiments described above. The component comprises a ceramic base body 10 made up of a plurality of ceramic layers which are sintered to form a monolithic base body. The ceramic layers comprise the ceramic material with the ternary system
$[(Bi_{0.5}Na_{0.5}TiO_3)_{(1-y)}(BaTiO_3)_y]_{(1-x)}(K_{0.5}Na_{0.5}NbO_3)_x$,
where $0<x\leq0.12$ and $0.1\leq y\leq0.5$. Electrodes 20 are arranged between the ceramic layers. Furthermore, external electrodes 30, which contact the electrodes 20 in the base body in an alternating manner, are arranged on the sides of the base body. Connection elements 40, which are contacted via conductors 50, are present on the external electrodes.

This component can be used, for example, as a piezo actuator in an injection system. If a field is applied via the conductors 50, the base body 10 undergoes an elongation. When the field is switched off, the elongation of the base body also declines.

The embodiments shown in the figures and exemplary embodiments can be varied as desired. In addition, it should be taken into consideration that the invention is not restricted to the examples, but instead permits further refinements which are not explained here.

List Of Reference Symbols
P Polarization in μC/cm²
E Electric field in kV/mm
S Elongation in ‰
$P_{max}$ Maximum polarization in μC/cm²
$P_r$ Remanent polarization in μC/cm²
$E_c$ Coercive field strength in kV/mm
$S_{max}/E_{max}$ Large-signal piezoelectric coefficient in pm/V
$d_{33}$ Small-signal piezoelectric coefficient in pC/N
$\epsilon_r$ Relative permittivity
T Temperature in ° C.
S1 Compositions $[BNT_{0.9}(BT)_{0.1}]_{(1-x)}(KNN)_x$
S2 Compositions $[BNT_{0.85}(BT)_{0.15}]_{(1-x)}(KNN)_x$
S3 Compositions $[BNT_{0.8}(BT)_{0.2}]_{(1-x)}(KNN)_x$
S4 Compositions $[BNT_{0.7}(BT)_{0.3}]_{(1-x)}(KNN)_x$
S5 Compositions $[BNT_{0.6}(BT)_{0.4}]_{(1-x)}(KNN)_x$
S6 Compositions $[BNT_{0.5}(BT)_{0.5}]_{(1-x)}(KNN)_x$
10 Base body
20 Electrodes
30 External electrodes
40 Connection elements
50 Conductors

The invention claimed is:

1. A ceramic material comprising:
material having the formula $[(Bi_{0.5}Na_{0.5}TiO_3)_{(1-y)}(BaTiO_3)_y]_{(1-x)}(K_{0.5}Na_{0.5}NbO_3)_x$, wherein $0<x\leq0.12$ and $0.1\leq y\leq0.5$.

2. The material according to claim 1, said material being lead-free.

3. The material according to claim 1, where x=0.09 and y=0.2.

4. The material according to claim 1, where x=0.085 and y=0.3.

5. The material according to claim 1, where x=0.075 and y=0.4.

6. The material according to claim 1, where $x=0.07$ and $y=0.5$.

7. The material according to claim 1, where $x=0.06$ and $y=0.1$.

8. A method for producing a ceramic material, the material having the formula $[(Bi_{0.5}Na_{0.5}TiO_3)_{(1-y)}(BaTiO_3)_y]_{(1-x)}(K_{0.5}Na_{0.5}NbO_3)_x$, wherein $0<x\leq0.12$ and $0.1\leq y\leq0.5$, said method comprising the following steps:
   A) powdery oxygen-containing compounds of Bi, Na, K, Ti, Ba and Nb are mixed in a stoichiometric ratio to produce a starting mixture;
   B) the starting mixture is ground and calcined to produce a powdery solid solution; and
   C) the powdery solid solution is pressed and sintered.

9. The method according to claim 8, wherein, in method step A), starting materials are selected from a group comprising oxides and carbonates of Bi, Na, K, Ti, Ba and Nb.

10. The method according to claim 8, wherein, in method step B), the starting mixture is ground in a solvent, dried and calcined at a temperature in the range of 800° C. to 950° C.

11. The method according to claim 8, wherein, in method step C), the ground powdery solid solution is pressed to form disks and sintered at a temperature in the range of 1150° C. to 1200° C.

12. A component comprising at least one ceramic base body and at least two electrodes arranged on the base body, wherein the base body comprises: a ceramic material of the formula $[(Bi_{0.5}Na_{0.5}TiO_3)_{(1-y)}(BaTiO_3)_y]_{(1-x)}(K_{0.5}Na_{0.5}NbO_3)_x$, where $0<x\leq0.12$ and $0.1\leq y\leq0.5$.

13. The component according to claim 12, wherein the base body comprises: a multiplicity of stacked layers, which comprise the ceramic material, with electrodes arranged therebetween, wherein the electrodes are electrically contacted via external electrodes arranged on the outer surface of the base body.

14. Use of the component according to claim 12 as an actuator.

15. Use of the component according to claim 12 as a sensor.

* * * * *